US012757325B2

(12) United States Patent
Masago et al.

(10) Patent No.: US 12,757,325 B2
(45) Date of Patent: Oct. 6, 2026

(54) CIRCUIT BOARD UNIT AND ELECTRONIC APPARATUS

(71) Applicant: SEIKO EPSON CORPORATION, Tokyo (JP)

(72) Inventors: Yu Masago, Ueda (JP); Toshiyuki Omori, Tatsuno-machi (JP); Masaaki Ito, Ina (JP); Takeshi Hirai, Kodaira (JP)

(73) Assignee: SEIKO EPSON CORPORATION, Tokyo (JP)

( * ) Notice: Subject to any disclaimer, the term of this patent is extended or adjusted under 35 U.S.C. 154(b) by 329 days.

(21) Appl. No.: 18/374,481

(22) Filed: Sep. 28, 2023

(65) Prior Publication Data

US 2024/0114618 A1 Apr. 4, 2024

(30) Foreign Application Priority Data

Sep. 29, 2022 (JP) ................................ 2022-155869

(51) Int. Cl.
*H05K 1/02* (2006.01)
*H05K 1/11* (2006.01)

(52) U.S. Cl.
CPC ............ *H05K 1/11* (2013.01); *H05K 1/0216* (2013.01); *H05K 2201/1031* (2013.01)

(58) Field of Classification Search
CPC ...... H05K 1/02; H05K 1/0216; H05K 1/0219; H05K 1/11; H05K 1/14; H05K 2201/1031
USPC .......................................................... 174/261
See application file for complete search history.

(56) References Cited

U.S. PATENT DOCUMENTS

| | | | |
|---|---|---|---|
| 2002/0060906 A1 | 5/2002 | Akiba | |
| 2018/0270946 A1 | 9/2018 | Ito | |
| 2022/0272833 A1 | 8/2022 | Ishigami et al. | |

FOREIGN PATENT DOCUMENTS

| | | | | |
|---|---|---|---|---|
| JP | S56-164595 U | 12/1981 | | |
| JP | H05-206604 A | 8/1993 | | |
| JP | H10-256683 A | 9/1998 | | |
| JP | 2002-158420 A | 5/2002 | | |
| JP | 2006-350243 A | 12/2006 | | |
| JP | 2018-157057 A | 10/2018 | | |
| JP | 2018-207019 A | 12/2018 | | |
| JP | 2022127586 A * | 8/2022 | | H05K 1/14 |

* cited by examiner

*Primary Examiner* — Timothy J Thompson
*Assistant Examiner* — Guillermo J Egoavil
(74) *Attorney, Agent, or Firm* — Oliff PLC

(57) ABSTRACT

A circuit board unit includes a first circuit board having a first ground layer, a second circuit board having a second ground layer and arranged so as to be opposed to the first circuit board, a connector unit having a first connector attached to the first circuit board, and a second connector attached to the second circuit board and coupled to the first connector, and a metal member arranged between the first circuit board and the second circuit board, and configured to electrically couple the first ground layer and the second ground layer to each other. The metal member is arranged so as to be adjacent to the connector unit.

10 Claims, 11 Drawing Sheets

CIRCUIT BOARD UNIT AND ELECTRONIC APPARATUS

The present application is based on, and claims priority from JP Application Serial Number 2022-155869, filed Sep. 29, 2022, the disclosure of which is hereby incorporated by reference herein in its entirety.

BACKGROUND

1. Technical Field

The present disclosure relates to a circuit board unit and an electronic apparatus.

2. Related Art

There has been known such a board-to-board connector for coupling circuit boards to each other as described in, for example, JP-A-2018-207019 (Document 1).

In such a board-to-board connector as described above, an unwanted radiation noise, in other words an electromagnetic noise, is apt to occur when a signal such as a high-frequency signal flows from one of the circuit boards to the other of the circuit boards, and it is required to make it possible to suppress the unwanted radiation noise. In contrast, in Document 1, for example, suppression of the unwanted radiation noise is attempted by enhancing the connection between GND patterns of the circuit boards. However, there is a problem that it is unachievable to sufficiently suppress the unwanted radiation noise only by such a countermeasure.

SUMMARY

A circuit board unit according to the present disclosure includes a first circuit board having a first ground layer, a second circuit board having a second ground layer and arranged so as to be opposed to the first circuit board, a connector unit having a first connector attached to the first circuit board, and a second connector attached to the second circuit board and coupled to the first connector, and a metal member arranged between the first circuit board and the second circuit board, and configured to electrically couple the first ground layer and the second ground layer to each other. The metal member is arranged so as to be adjacent to the connector unit.

An electronic apparatus according to the present disclosure includes the circuit board unit described above.

DESCRIPTION OF EXEMPLARY EMBODIMENTS

Figure 1:
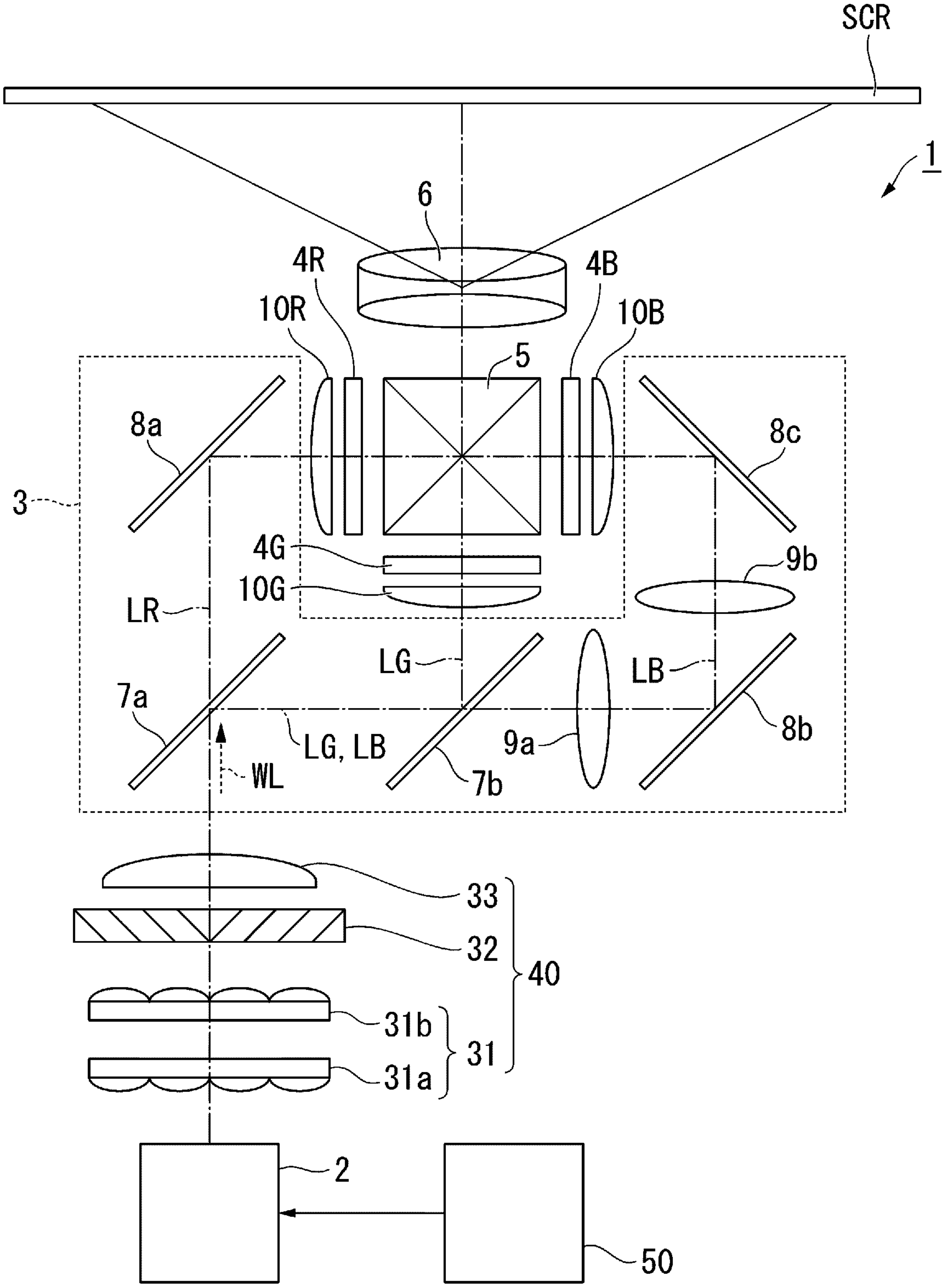
FIG. 1 is a schematic configuration diagram showing a projector according to a first embodiment.

Some embodiments of the present disclosure will hereinafter be described with reference to the drawings. In the following embodiments, there is provided a description citing a projector as an example of an electronic apparatus.

It should be noted that the scope of the present disclosure is not limited to the embodiments hereinafter described, but can arbitrarily be modified within a range of the technical idea or the technical concept of the present disclosure. Further, in the drawings hereinafter described, actual structures and structures in the drawings are made different from each other in scale size, number, and so on of each of the constituents in some cases in order to make the constituents easy to understand.

First Embodiment

FIG. 1 is a schematic configuration diagram showing a projector 1 as the electronic apparatus according to the present embodiment.

The projector 1 according to the present embodiment is a projection-type image display device for projecting a color image on a screen SCR. As shown in FIG. 1, the projector 1 is provided with a light source device 2, a homogenous illumination optical system 40, a color separation optical system 3, a light modulation device 4R, a light modulation device 4G, a light modulation device 4B, a combining optical system 5, a projection optical device 6, and a control device 50. The light source device 2 emits illumination light WL toward the homogeneous illumination optical system 40.

The homogeneous illumination optical system. 40 is provided with an integrator optical system 31, a polarization conversion element 32, and a superimposing optical system 33. The integrator optical system 31 is provided with a first lens array 31*a* and a second lens array 31*b*. The homogenous illumination optical system 40 homogenizes the intensity distribution of the illumination light WL emitted from the light source device 2 in each of the light modulation device 4R, the light modulation device 4G, and the light modulation device 4B as illumination target areas. The illumination light WL having been emitted from the homogeneous illumination optical system 40 enters the color separation optical system 3.

The color separation optical system 3 separates the illumination light WL having a white color into red light LR, green light LG, and blue light LB. The color separation optical system 3 is provided with a first dichroic mirror 7*a*, a second dichroic mirror 7*b*, a first reflecting mirror 8*a*, a second reflecting mirror 8*b*, a third reflecting mirror 8*c*, a first relay lens 9*a*, and a second relay lens 9*b*.

The first dichroic mirror 7*a* separates the illumination light WL from the light source device 2 into the red light LR and the rest of the light, namely the green light LG and the blue light LB. The first dichroic mirror 7*a* transmits the red light LR thus separated from, and at the same time reflects the rest of the light, namely the green light LG and the blue light LB. Meanwhile, the second dichroic mirror 7*b* separates the rest of the light into the green light LG and the blue light LB. The second dichroic mirror 7*b* reflects the green light LG thus separated from, and transmits the blue light LB.

The first reflecting mirror 8*a* is arranged in a light path of the red light LR, and the red light LR which has been transmitted through the first dichroic mirror 7*a* is reflected by the first reflecting mirror 8*a* toward the light modulation device 4R. Meanwhile, the second reflecting mirror 8*b* and the third reflecting mirror 8*c* are arranged in a light path of the blue light LB, and the blue light LB which has been transmitted through the second dichroic mirror 7*b* is reflected by the second reflecting mirror 8*b* and the third reflecting mirror 8*c* toward the light modulation device 4B. Further, the green light LG is reflected by the second dichroic mirror 7*b* toward the light modulation device 4G.

The first relay lens 9*a* and the second relay lens 9*b* are arranged at the light exit side of the second dichroic mirror 7*b* in the light path of the blue light LB. The first relay lens 9*a* and the second relay lens 9*b* correct a difference in illuminance distribution of the blue light LB due to the fact that the blue light LB is longer in optical path length than the red light LR and the green light LG.

The light modulation device 4R modulates the red light LR in accordance with image information to form image light corresponding to the red light LR. The light modulation device 4G modulates the green light LG in accordance with the image information to form image light corresponding to the green light LG. The light modulation device 4B modulates the blue light LB in accordance with the image information to form image light corresponding to the blue light LB.

As the light modulation device 4R, the light modulation device 4G, and the light modulation device 4B, there are used, for example, transmissive liquid crystal panels. Further, at an incident side and an exit side of the liquid crystal panel, there are respectively arranged polarization plates not shown, and thus, there is formed a configuration of transmitting only the linearly-polarized light with a specific direction.

At the incident side of the light modulation device 4R, the light modulation device 4G, and the light modulation device 4B, there are arranged a field lens 10R, a field lens 10G, and a field lens 10B, respectively. The field lens 10R, the field lens 10G, and the field lens 10B collimate principal rays of the red light LR, the green light LG, and the blue light LB which enter the light modulation device 4R, the light modulation device 4G, and the light modulation device 4B, respectively.

The combining optical system 5 combines the image light corresponding to the red light LR, the image light corresponding to the green light LG, and the image light corresponding to the blue light LB with each other in response to incidence of the image light emitted from the light modulation device 4R, the image light emitted from the light modulation device 4G, and the image light emitted from the light modulation device 4B, and then emits the image light thus combined toward the projection optical device 6. As the combining optical system 5, there is used, for example, a cross dichroic prism.

The projection optical device 6 is constituted by a plurality of projection lenses. The projection optical device 6 projects the image light having been combined by the combining optical system 5 toward the screen SCR in an enlarged manner. Thus, an image is displayed on the screen SCR.

Then, the control device 50 will be described.

Figure 2:
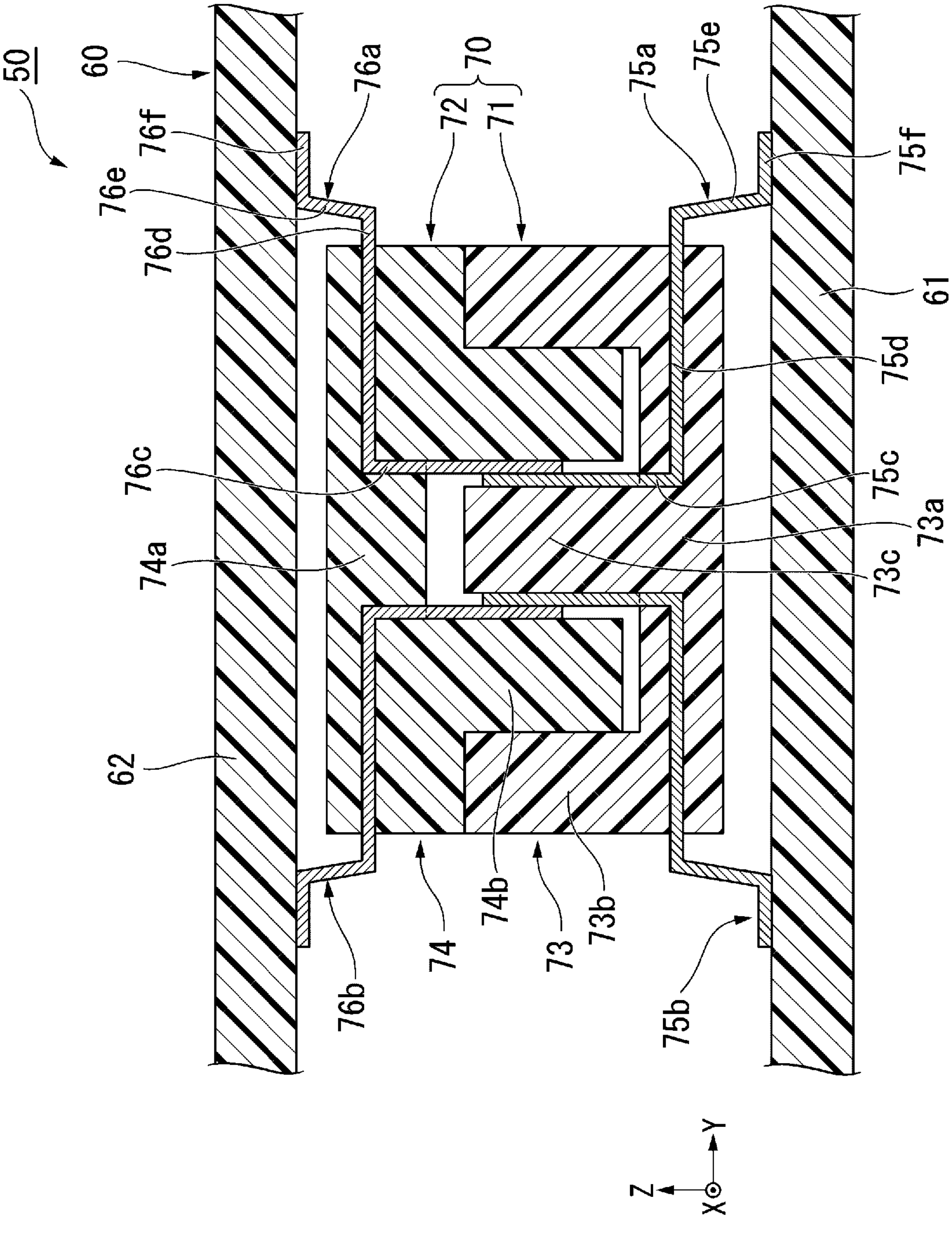
FIG. 2 is a cross-sectional view showing a part of a circuit board unit according to the first embodiment.
Figure 3:
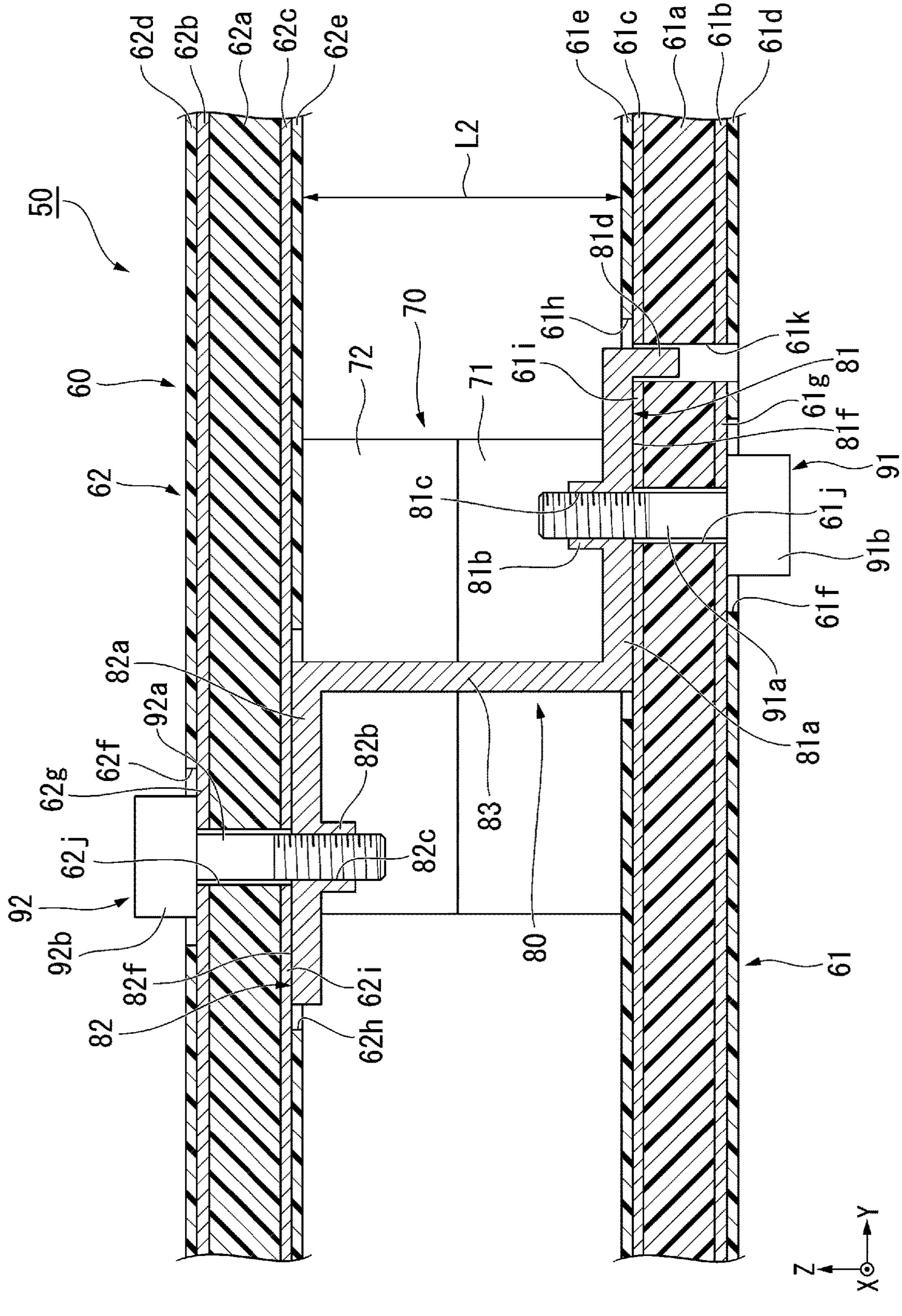
FIG. 3 is a cross-sectional view showing a part of the circuit board unit according to the first embodiment, and is a diagram showing a cross-sectional surface different from that in FIG. 2.
Figure 4:
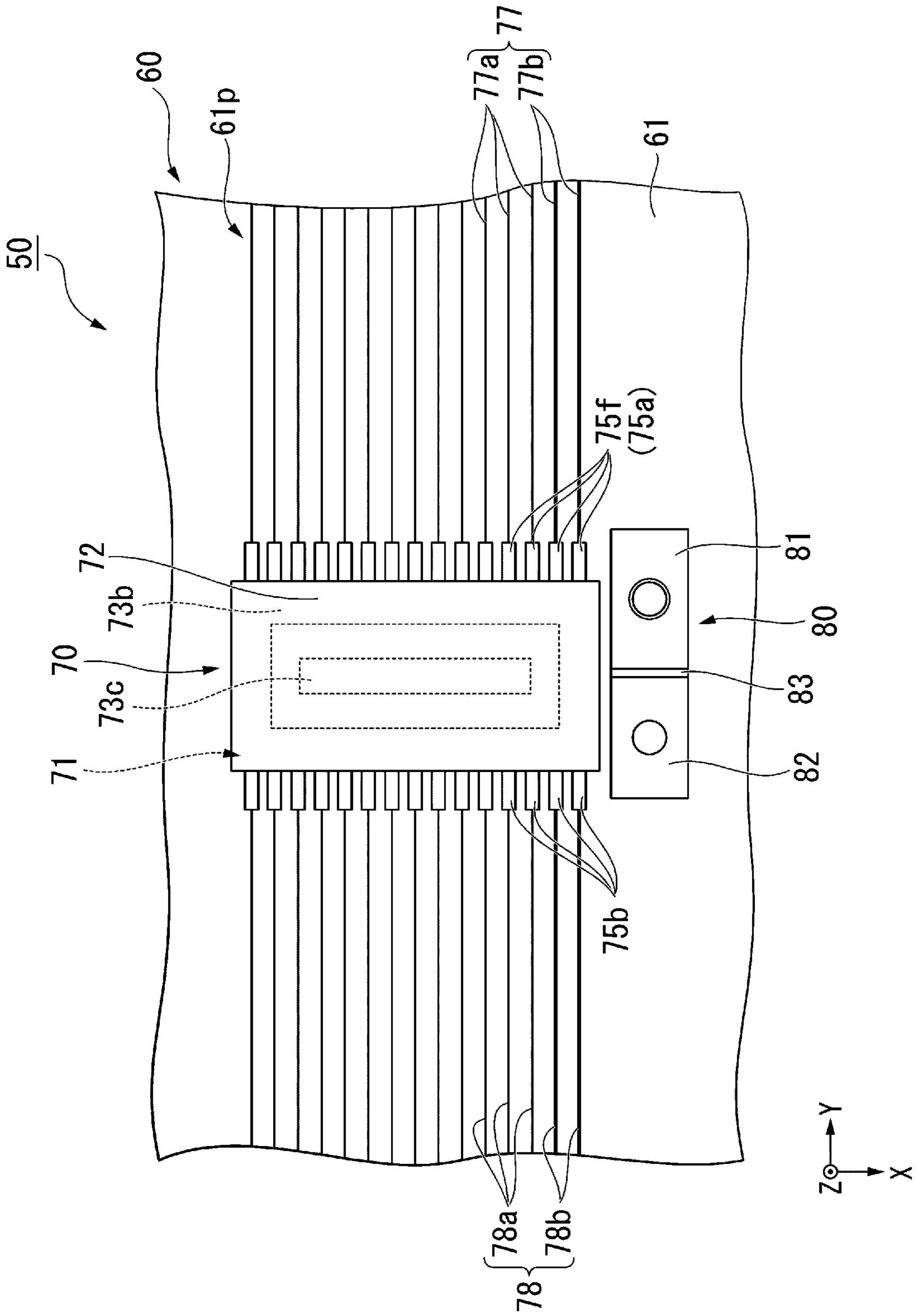
FIG. 4 is a plan view showing a part of the circuit board unit according to the first embodiment.
Figure 5:
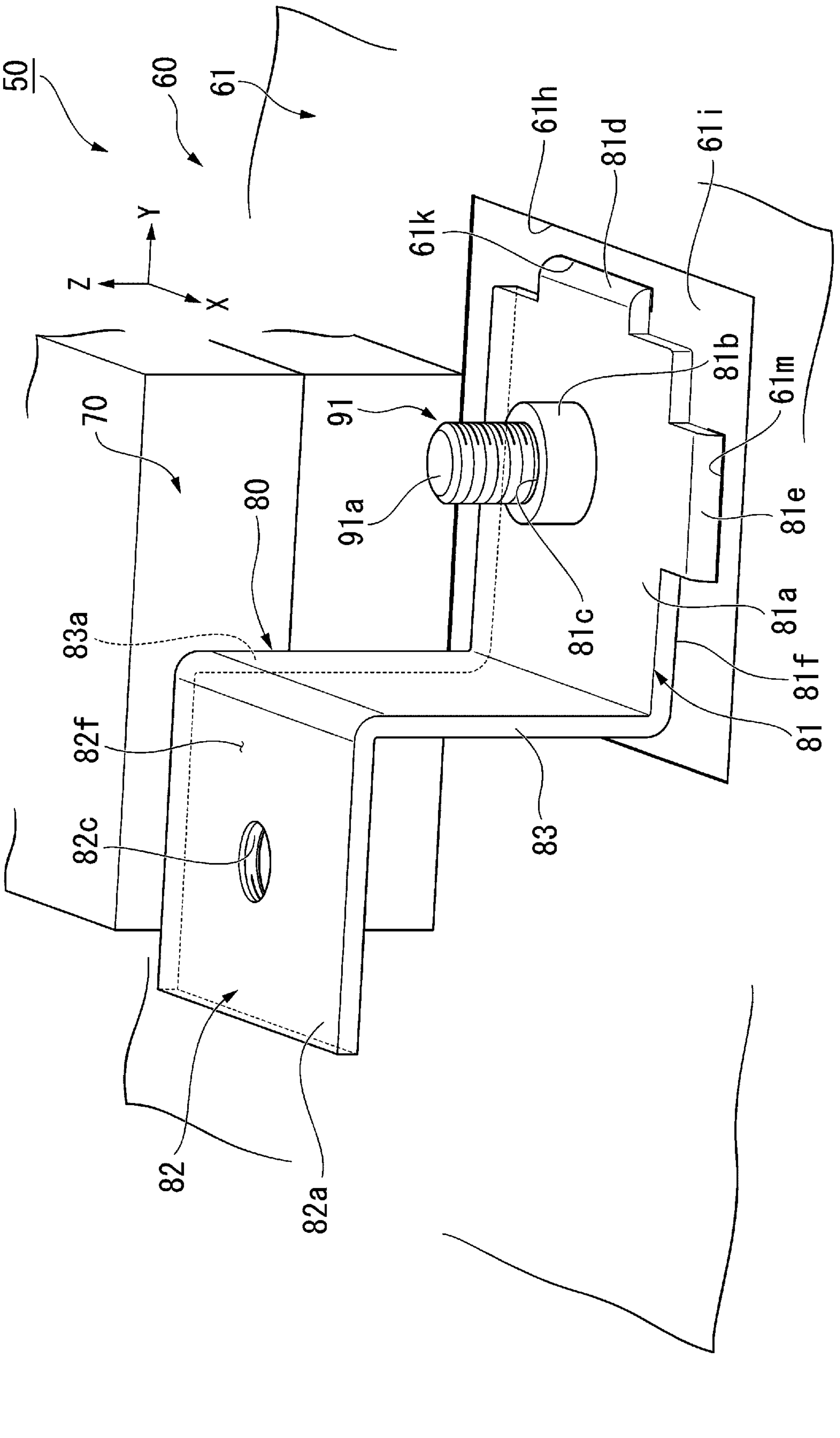
FIG. 5 is a perspective view showing a part of the circuit board unit according to the first embodiment.
Figure 6:
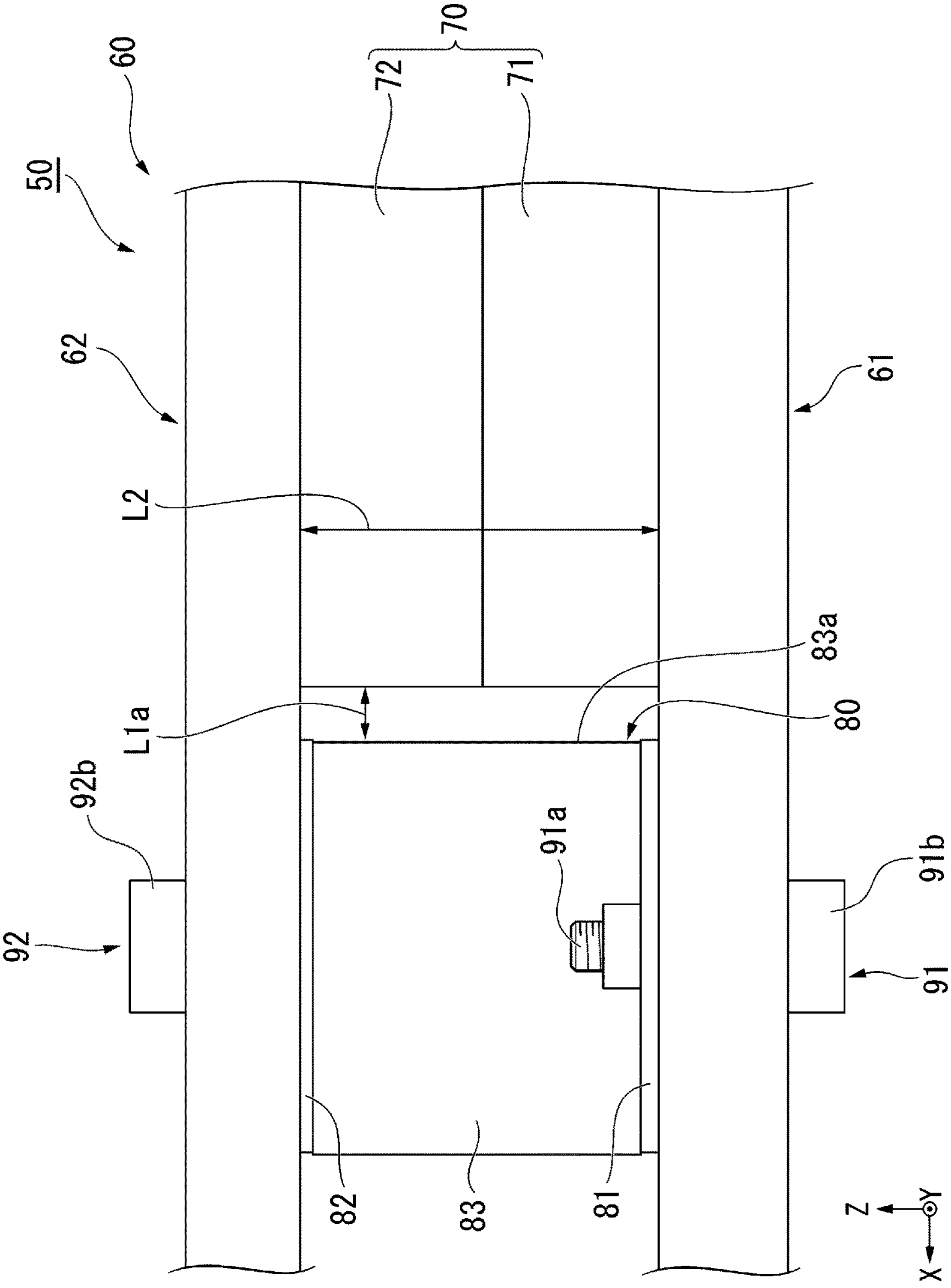
FIG. 6 is a side view showing a part of the circuit board unit according to the first embodiment.

FIG. 2 is a cross-sectional view showing a part of a circuit board unit 60 in the control device 50. FIG. 3 is a cross-sectional view showing a part of the circuit board unit 60, and is a diagram showing a cross-sectional surface different from that in FIG. 2. FIG. 4 is a plan view showing a part of the circuit board unit 60. FIG. 5 is a perspective view showing a part of the circuit board unit 60. FIG. 6 is a side view showing a part of the circuit board unit 60.

In each of the drawings, there are arbitrarily shown an X axis, a Y axis, and a Z axis. A direction parallel to the X axis is referred to as a "first horizontal direction X," a direction parallel to the Y axis is referred to as a "second horizontal direction Y," and a direction parallel to the Z axis is referred to as a "vertical direction Z." The first horizontal direction X, the second horizontal direction Y, and the vertical direction Z are directions perpendicular to each other. A side to which an arrow of the Z axis points in the vertical direction Z, namely a +Z side, is referred to as an "upper side," and a side opposite to the side to which the arrow of the Z axis points in the vertical direction Z, namely a −Z side, is referred to as a "lower side." A side to which an arrow of the X axis points in the first horizontal direction X, namely a +X side, is referred to as "one side in the first horizontal direction," and a side opposite to the side to which the arrow of the X axis points in the first horizontal direction X, namely a −X side, is referred to as "the other side in the first horizontal direction." A side to which an arrow of the Y axis points in the second horizontal direction Y, namely a +Y side, is referred to as "one side in the second horizontal direction," and a side opposite to the side to which the arrow of the Y axis points in the second horizontal direction Y, namely a −Y side, is referred to as "the other side in the second horizontal direction." The first horizontal direction X corresponds to a "predetermined direction," the second horizontal direction Y corresponds to a "perpendicular direction," and the vertical direction Z corresponds to a "coupling direction."

It should be noted that the vertical direction Z, the first horizontal direction X, and the second horizontal direction Y are mere names for describing a relative positional relationship between the constituents and so on, and the actual arrangement relationship and so on can be different from the arrangement relationship and so on represented by these names.

The control device 50 is a main board for controlling each section of the projector 1 including the light source device 2. As shown in FIG. 2 through FIG. 6, the control device 50 has the circuit board unit 60. As shown in FIG. 2, the circuit board unit 60 is provided with a first circuit board 61, a second circuit board 62, and a connector unit 70. The first circuit board 61 and the second circuit board 62 are electrically coupled to each other via the connector unit 70. The first circuit board 61 and the second circuit board 62 are coupled to each other in the vertical direction Z. The second circuit board 62 is arranged at an upper side of the first circuit board 61 so as to be opposed to the first circuit board 61.

The first circuit board 61 and the second circuit board 62 are each shaped like a plate having plate surfaces facing to the vertical direction, and extend along the first horizontal direction X and the second horizontal direction Y. In other words, the first horizontal direction X and the second horizontal direction Y perpendicular to each other in the present embodiment are directions along which the first circuit board 61 and the second circuit board 62 extend. In the present embodiment, the first circuit board 61 and the second circuit board 62 are each a printed circuit board provided with wiring patterns formed of copper foil. The first circuit board 61 and the second circuit board 62 are boards having structures of the same type, and are arranged so as to be flipped in the vertical direction Z from each other. In the following description, regarding the configuration substantially the same as that of the first circuit board 61 except the point that the configuration is flipped in the vertical direction Z, the description of the second circuit board 62 will partially be omitted in some cases.

As shown in FIG. 3, the first circuit board 61 has a first base part 61*a*, a pair of first ground layers 61*b*, 61*c*, and a pair of first resist layers 61*d*, 61*e*. The first base part 61*a* can be formed of a single layer alone, or can also be formed of a plurality of layers. The first ground layer 61*b* is stacked at a lower side of the first base part 61*a*. The first ground layer 61*c* is stacked at an upper side of the first base part 61*a*. The first resist layer 61*d* is stacked at a lower side of the first ground layer 61*b*. The first resist layer 61*e* is stacked at an upper side of the first ground layer 61*c*.

A lower surface of the first resist layer 64*d* forms a lower surface of the first circuit board 61. An upper surface of the first resist layer 64*e* forms an upper surface of the first circuit board 61. The upper surface of the first circuit board 61 is a mounting surface to be attached with an electronic element and so on. The first ground layers 61*b*, 61*c* are layers the potential of which is set at a reference potential in the circuit board unit 60. The first ground layers 61*b*, 61*c* are each formed of, for example, a solid pattern made of copper foil. The first ground layers 61*b*, 61*c* are also called a reference plane.

The first ground layers 61*b*, 61*c* have first ground pad parts 61*g*, 61*i*, respectively. The first ground pad part 61*g* is a portion which is exposed at the lower side of the first circuit board 61 via an opening 61*f* provided to the first resist layer 61*d*. Although not shown in the drawings, the first ground pad part 61*g* has a circular shape when viewed in, for example, the vertical direction Z. The first ground pad part 61*i* is a portion which is exposed at the upper side of the first circuit board 61 via an opening 61*h* provided to the first resist layer 61*e*. As shown in FIG. 5, in the present embodiment, the first ground pad part 61*i* has a rectangular shape elongated in the second horizontal direction Y when viewed in the vertical direction Z.

As shown in FIG. 4, the first circuit board 61 has a wiring layer 61*p*. The wiring layer 61*p* is a layer constituted by a plurality of wiring patterns formed of copper foil. Although not shown in the drawings, the wiring layer 61*p* is disposed between the first ground layer 61*c* and the first resist layer 61*e*. Between the wiring layer 61*p* and the first ground layer 61*c*, there is disposed an insulating layer. It should be noted that in FIG. 4, an illustration of the first resist layer 61*e* is omitted.

The wiring patterns of the wiring layer 61*p* includes a plurality of signal lines 77 arranged side by side in the first horizontal direction X and a plurality of signal lines 78 arranged side by side in the first horizontal direction X. The plurality of signal lines 77 and the plurality of signal lines 78 are each electrically coupled to a first connector 71 described later. The plurality of signal lines 77 is located at one side in the second horizontal direction of the first connector 71. The plurality of signal lines 78 is located at the other side in the second horizontal direction of the first connector 71.

The plurality of signal lines 77 includes first signal lines 77*a* and second signal lines 77*b*. A signal flowing through the second signal lines 77*b* is higher in frequency than a signal flowing through the first signal lines 77*a*. There are disposed a plurality of the first signal lines 77*a* and a plurality of the second signal lines 77*b*. In the present embodiment, there are disposed two second signal lines 77*b*. The signal lines 77 other than the two second signal lines 77*b* out of the plurality of signal lines 77 are the first signal lines 77*a*. The number of the second signal lines 77*b* is smaller than the number of the first signal lines 77*a*. The second signal lines 77*b* are located at one side in the first horizontal direction, namely at the +X side, of the plurality of the first signal lines 77*a*. In the present embodiment, the two signal lines 77, namely the signal line 77 located at the extreme one side in the first horizontal direction out of the plurality of signal lines 77, and the signal line 77 located at the second from the one side in the first horizontal direction out of the plurality of signal lines 77, are the second signal lines 77*b*. The signal flowing through the second signal lines 77*b* is a high-frequency signal. The frequency of the signal flowing through the second signal lines 77*b* is, for example, no lower than 20 MHz.

The plurality of signal lines 78 includes first signal lines 78*a* and second signal lines 78*b* similarly to the plurality of signal lines 77. The first signal lines 78*a* are substantially the same in configuration as the first signal lines 77*a* except the point that the first signal lines 78*a* are arranged at the other side in the second horizontal direction, namely the −Y side, with respect to the first connector 71. The second signal lines 78*b* are substantially the same in configuration as the second signal lines 77*b* except the point that the second signal lines 78*b* are arranged at the other side in the second horizontal direction with respect to the first connector 71.

As shown in FIG. 3, the second circuit board 62 has a second base part 62*a*, a pair of second ground layers 62*b*, 62*c*, and a pair of second resist layers 62*d*, 62*e*. Although not shown in the drawings, the second circuit board 62 has a wiring layer similarly to the first circuit board 61. The second base part 62*a* can be formed of a single layer alone, or can also be formed of a plurality of layers. The second ground layer 62*b* is stacked at an upper side of the second base part 62*a*. The second ground layer 62*c* is stacked at a lower side of the second base part 62*a*. The second resist layer 62*d* is stacked at an upper side of the second ground layer 62*b*. The second resist layer 62*e* is stacked at a lower side of the second ground layer 62*c*.

A lower surface of the second resist layer 64*e* forms a lower surface of the second circuit board 62. The lower surface of the second circuit board 62 is a mounting surface to be attached with an electronic element and so on. An upper surface of the second resist layer 62*d* forms an upper surface of the second circuit board 62. The second ground layers 62*b*, 62*c* are layers the potential of which is set at a reference potential in the circuit board unit 60. The second ground layers 62*b*, 62*c* are each formed of, for example, a solid pattern made of copper foil. The second ground layers 62*b*, 62*c* are also called a reference plane.

The second ground layers 62*b*, 62*c* have second ground pad parts 62*g*, 62*i*, respectively. The second ground pad part 62*g* is a portion which is exposed at the upper side of the second circuit board 62 via an opening 62*f* provided to the second resist layer 62*d*. Although not shown in the drawings, the second ground pad part 62*g* has a circular shape when viewed in, for example, the vertical direction Z. The second ground pad part 62*i* is a portion which is exposed at the lower side of the second circuit board 62 via an opening 62*h* provided to the second resist layer 62*e*. Although not shown in the drawings, in the present embodiment, the second ground pad part 62*i* has a rectangular shape elongated in the second horizontal direction Y.

The connector unit 70 relays signal transmission between the first circuit board 61 and the second circuit board 62. As shown in FIG. 4, in the present embodiment, the connector unit 70 has a shape elongated in the first horizontal direction X when viewed in the vertical direction Z. In the present embodiment, the connector unit 70 has a rectangular shape elongated in the first horizontal direction X when viewed in the vertical direction Z. It should be noted that in FIG. 3 through FIG. 6, the connector unit 70 is schematically shown.

As shown in FIG. 2, the connector unit 70 has the first connector 71 and a second connector 72. The first connector 71 is attached to the upper surface of the first circuit board 61. The second connector 72 is attached to the lower surface of the second circuit board 62. The first connector 71 and the second connector 72 are coupled to each other in the vertical direction Z. In other words, in the present embodiment, a coupling direction between the first connector 71 and the second connector 72 is the vertical direction Z.

In the present embodiment, the first connector 71 is an external connector, and the second connector 72 is an internal connector. The first connector device 71 and the second connector 72 are fitted in each other in the vertical direction Z to electrically be coupled to each other. In other words, in the present embodiment, a fitting direction between the first connector 71 and the second connector 72 is the vertical direction Z.

The first connector 71 has a first housing 73, a plurality of first couplers 75*a*, and a plurality of first couplers 75*b*. The first housing 73 is a member made of resin for holding the plurality of first couplers 75*a* and the plurality of first couplers 75*b*. The first housing 73 is formed by, for example, insert molding using the plurality of first couplers 75*a* and the plurality of first couplers 75*b* as insert members. The first housing 73 is shaped like a substantially rectangular solid box opening upward.

The first housing 73 has a bottom wall part 73*a* forming a wall part at a lower side, a circumferential wall part 73*b* protruding upward from the outer circumferential edge portion of the bottom wall part 73*a*, and a protruding part 73*c* protruding upward from the bottom wall part 73*a* at an inner side of the circumferential wall part 73*b*. As shown in FIG. 4, the circumferential wall part 73*b* is shaped like a rectangular frame elongated in the first horizontal direction X. The protruding part 73*c* is shaped like a rectangular solid extending in the first horizontal direction X. An outer circumferential surface of the protruding part 73*c* is arranged at a distance from the inner circumferential surface of the circumferential wall part 73*b* throughout the entire circumference. As shown in FIG. 2, the first housing 73 is arranged above the first circuit board 61 at a distance from the upper surface thereof via a gap.

The plurality of first couplers 75*a* and the plurality of first couplers 75*b* are held by the first housing 73. Apart of each of the first couplers 75*a*, 75*b* is embedded in the first housing 73. The first couplers 75*a*, 75*b* are each an elongated plate-like member made of metal. The plurality of first couplers 75*a* is held by a portion at one side in the second horizontal direction of the first housing 73. The plurality of first couplers 75*b* is held by a portion at the other side in the second horizontal direction, namely the −Y side, of the first housing 73.

As shown in FIG. 4, the plurality of first couplers 75*a* is arranged side by side at intervals along the first horizontal direction X. The plurality of first couplers 75*b* is arranged side by side at intervals along the first horizontal direction X. The first couplers 75*b* are each arranged at a position across the protruding part 73*c* from corresponding one of the first couplers 75*a* in the second horizontal direction Y. The first couplers 75*a* and the second couplers 75*b* are members having substantially the same shapes as each other. The first couplers 75*a* and the first couplers 75*b* are arranged symmetrically to each other in the second horizontal direction Y across the protruding part 73*c*.

As shown in FIG. 2, the first couplers 75*a* each include a first extending part 75*c*, a second extending part 75*b*, a third extending part 75*e*, and a board coupling part 75*f*. The first extending part 75*c* extends in the vertical direction Z. A lower end portion of the first extending part 75*c* is embedded in the bottom wall part 73*a*. A portion located above the lower end portion out of the first extending part 75*c* protrudes upward from the bottom wall part 73*a* to be exposed from the first housing 73, and is electrically coupled to a first extending part 76*c* described later. A portion located above the lower end portion out of the first extending part 75*c* is located at one side in the second horizontal direction with respect to the protruding part 73*c* out of an inner side of the circumferential wall part 73*b*.

The second extending part 75*b* extends from the lower end portion of the first extending part 75*c* toward the one side in the second horizontal direction, namely the +Y side. An end portion at the one side in the second horizontal direction of the second extending part 75*d* protrudes from the side surface of the first housing 73 toward the one side in the second horizontal direction, and is exposed from the first housing 73. A portion of the second extending part 75*d* except the end portion at the one side in the second horizontal direction is embedded in the bottom wall part 73*a*.

The third extending part 75*e* extends from an end portion at the one side in the second horizontal direction, namely the +Y side, of the second extending part 75*d* downward and obliquely toward the one side in the second horizontal direction. A lower end portion of the third extending part 75*e* is located below the first housing 73. The board coupling part 75*f* extends from the lower end portion of the third extending part 75*e* toward the one side in the second horizontal direction. The board coupling part 75*f* is electrically coupled to the first circuit board 61. As shown in FIG. 4, the board coupling parts 75*f* in the plurality of first couplers 75*a* are electrically coupled to the plurality of signal lines 77, respectively. More particularly, the board coupling part 75*f* makes contact with a portion exposed on the upper surface of the first circuit board 61 out of the signal line 77, and is electrically coupled to that signal line 77.

The first coupler 75*b* has a first extending part, a second extending part, a third extending part, and a board coupling part similarly to the first coupler 75*a*. The parts of the first coupler 75*b* have substantially the same shapes as those of the respective parts having substantially the same names in the first coupler 75*a* except the point that those are symmetric with respect to the second horizontal direction Y. The board coupling parts in the plurality of first couplers 75*b* are electrically coupled to the plurality of signal lines 78, respectively.

As shown in FIG. 2, the second connector 72 has a second housing 74, a plurality of second couplers 76*a*, and a plurality of second couplers 76*b*. The second housing 74 is a member made of resin for holding the plurality of second couplers 76*a* and the plurality of second couplers 76*b*. The second housing 74 is formed by, for example, insert molding using the plurality of second couplers 76*a* and the plurality of second couplers 76*b* as insert members.

The second housing 74 is shaped like a substantially rectangular solid box opening downward. The second housing 74 has a top wall part 74*a* forming an upper wall part, and a circumferential wall part 74*b* protruding downward from a central portion of the top wall part 74*a*. The circumferential wall part 74*b* is shaped like a rectangular frame elongated in the first horizontal direction X. An outer circumferential edge portion of the circumferential wall part 74*b* is located at a distance inward from the outer circumferential edge portion of the top wall part 74*a*. The top wall part 74*a* and the circumferential wall part 74*b* form a recessed part recessed upward. The second housing 74 is arranged at a distance downward from the lower surface of the second circuit board 62 via a gap.

The second housing 74 is fitted in the first housing 73 in the vertical direction Z. In the present embodiment, the circumferential wall part 74*b* of the second housing 74 is fitted in the inside of the circumferential wall part 73*b* of the first housing 73 from above. A lower end portion of the circumferential wall part 74*b* is arranged above the bottom wall part 73*a* of the first housing 73 so as to be opposed thereto via a gap. A portion located at an outer side of the circumferential wall part 74*b* out of the top wall part 74*a* of the second housing 74 has contact with an upper end portion of the circumferential wall part 73*b* of the first housing 73. In the inside of the circumferential wall part 74*b* of the second housing 74, there is inserted the protruding part 73*c*. An upper end portion of the protruding part 73*c* is located at a distance downward from the top wall part 74*a*.

The plurality of second couplers 76*a* and the plurality of second couplers 76*b* are held by the second housing 74. A part of each of the second couplers 76*a*, 76*b* is embedded in the second housing 74. The second couplers 76*a*, 76*b* are each an elongated plate-like member made of metal. The plurality of second couplers 76*a* is held by a portion at the one side in the second horizontal direction of the second housing 74. The plurality of second couplers 76*b* is held by a portion at the other side in the second horizontal direction of the second housing 74.

Although not shown in the drawings, the plurality of second couplers 76*a* is arranged side by side at intervals along the first horizontal direction X. The plurality of second couplers 76*b* is arranged side by side at intervals along the first horizontal direction X. Each of the second couplers 76*b* is arranged at a position where the second coupler 76*b* is opposed to corresponding one of the second couplers 76*a* at a distance at the other side in the second horizontal direction. The second couplers 76*a* and the second couplers 76*b* are members having substantially the same shapes as each other. The second couplers 76*a* and the second couplers 76*b* are arranged symmetrically to each other in the second horizontal direction Y.

The second couplers 76*a* are each a member having substantially the same shape as that of the first coupler 75*a*. The second couplers 76*a* are each arranged in a posture flipped in the vertical direction Z with respect to the first coupler 75*a*. The second couplers 76*b* are each a member having substantially the same shape as that of the first coupler 75*b*. The second couplers 76*b* are each arranged in a posture flipped in the vertical direction Z with respect to the first coupler 75*b*.

The second couplers 76*a* each include a first extending part 76*c*, a second extending part 76*d*, a third extending part 76*e*, and a board coupling part 76*f*. The first extending part 76*c* extends in the vertical direction Z. An upper end portion of the first extending part 76*c* is embedded in the top wall part 74*a*. A portion located below the upper end portion out of the first extending part 76*c* protrudes downward from the top wall part 74*a* to be exposed from the second housing 74, and is electrically coupled to a portion protruding upward from the bottom wall part 73*a* out of the first extending part 75*c* of the first coupler 75*a*.

The second extending part 76*d* extends from an upper end portion of the first extending part 76*c* toward the one side in the second horizontal direction. An end portion at the one side in the second horizontal direction of the second extending part 76*d* protrudes from the side surface of the second housing 74 toward the one side in the second horizontal direction, and is exposed from the second housing 74. A portion of the second extending part 76*d* except the end portion at the one side in the second horizontal direction is embedded in the top wall part 74*a*.

The third extending part 76*e* extends from an end portion at the one side in the second horizontal direction of the second extending part 76*d* upward and obliquely toward the one side in the second horizontal direction. An upper end portion of the third extending part 76*e* is located above the second housing 74. The board coupling part 76*f* extends from the upper end portion of the third extending part 76*e* toward the one side in the second horizontal direction. The board coupling part 76*f* is electrically coupled to the second circuit board 62.

The second coupler 76*b* has a first extending part, a second extending part, a third extending part, and a board coupling part similarly to the second coupler 76*a*. The parts of the second coupler 76*b* have substantially the same shapes as those of the respective parts having substantially the same names in the second coupler 76*a* except the point that those are symmetric with respect to the second horizontal direction Y.

As shown in FIG. 3, the circuit board unit 60 is provided with a metal member 80 arranged between the first circuit board 61 and the second circuit board 62. The metal member 80 electrically couples the first ground layer 61*c* and the second ground layer 62*c* to each other. As shown in FIG. 3 and FIG. 5, in the present embodiment, the metal member 80 is a sheet-metal member. The material constituting the metal member 80 is not particularly limited providing the material is metal. It should be noted that it is possible to adopt an electrically conductive member such as carbon instead of the metal member 80.

As shown in FIG. 4 and FIG. 6, the metal member 80 is arranged so as to be adjacent to the connector unit 70. In the present embodiment, the metal member 80 is located at the one side in the first horizontal direction of the connector unit 70. In other words, in the present embodiment, the metal member 80 is arranged so as to be adjacent in the first horizontal direction X to the connector unit 70. As shown in FIG. 4, the metal member 80 is arranged at the same side as the side at which the second signal lines 77*b*, 78*b* are arranged with respect to the first signal lines 77*a*, 78*a* in the first horizontal direction X, namely the +X side, with respect to the connector unit 70. Thus, in the present embodiment, the second signal lines 77*b*, 78*b* are arranged at the positions closer to the metal member 80 than the first signal lines 77*a*, 78*a* in the first horizontal direction X.

As shown in FIG. 5, in the present embodiment, the metal member 80 has a main body part 83, a first coupling part 81, and a second coupling part 82. The main body part 83 extends in a coupling direction in which the first connector 71 and the second connector 72 are coupled to each other, namely the vertical direction Z. In the present embodiment, the main body part 83 is shaped like a plate having a plate surface facing to the second horizontal direction Y. The main body part 83 is shaped like a rectangular plate. The main body part 83 is located at the one side in the first horizontal direction of the connector unit 70. The side surface 83*a* at the other side in the first horizontal direction out of the side surfaces of the main body part 83 is arranged so as to be opposed to the connector unit 70 with a gap. In the present embodiment, the main body part 83 is arranged at the same position as a central portion in the second horizontal direction Y of the connector unit 70 in the second horizontal direction Y.

The first coupling part 81 protrudes toward the one side in the second horizontal direction from one end in the vertical direction Z of the main body part 83, namely a lower end of the main body part 83. The first coupling part 81 is shaped like a substantially rectangular plate having a plate surface facing to the vertical direction Z. The first coupling part 81 has contact with the first ground pad part 61*i* of the first ground layer 61*c* from above. A lower surface of the first coupling part 81 is a first coupling surface 81*f* electrically coupled to the first ground layer 61*c*. The first coupling surface 81*f* has contact with the first ground pad part 61*i*. Thus, the metal member 80 has contact with the first ground layer 61*c* on a surface opposed to the second circuit board 62, namely the upper surface, of the first circuit board 61. The first coupling surface 81*f* extends along the first ground layer 61*c* in a direction perpendicular to the vertical direction Z.

The first coupling part 81 has a plate-like part 81*a*, a cylindrical part 81*b*, and catching stop parts 81*d*, 81*e*. The plate-like part 81*a* is a part shaped like a rectangular plate. A lower surface of the plate-like part 81*a* is the first coupling surface 81*f*. The cylindrical part 81*b* protrudes upward from the plate-like part 81*a*. The cylindrical part 81*b* is shaped like a circular cylinder opening upward. The catching stop part 81*d* protrudes downward from an edge portion at one side in the second horizontal direction of the plate-like part 81*a*. As shown in FIG. 3, the catching stop part 81*d* is inserted from above into a catching hole part 61*k* provided to the first circuit board 61. The catching hole part 61*k* penetrates the first circuit board 61 in the vertical direction Z. As shown in FIG. 5, the catching stop part 81*e* protrudes downward from an edge portion at one side in the first horizontal direction of the plate-like part 81*a*. The catching stop part 81*e* is inserted from above into a catching hole part 61*m* provided to the first circuit board 61. The catching hole part 61*m* penetrates the first circuit board 61 in the vertical direction Z.

As shown in FIG. 3, the first coupling part 81 is provided with an internal threaded hole 81*c*. The internal threaded hole 81*c* penetrates the first coupling part 81 in the vertical direction Z. More particularly, the internal threaded hole 81*c* penetrates the plate-like part 81*a* and the cylindrical part 81*b* in the vertical direction Z. An inner circumferential surface of the cylindrical part 81*b* constitutes a part of an inner circumferential surface of the internal threaded hole 81*c*. The inner circumferential surface of the internal threaded hole 81*c* is provided with an internal thread part.

In the internal threaded hole 81*c*, there is tightened a bolt 91 made of metal for fixing the first coupling part 81 to the first circuit board 61. The bolt 91 is threaded from below through a through hole 61*j* provided to the first circuit board 61. The through hole 61*j* penetrates the first circuit board 61 in the vertical direction Z. An inner diameter of the through hole 61*j* is larger than an inner diameter of the internal threaded hole 81*c*.

The bolt 91 has a bolt main body part 91*a* and a bolt head part 91*b*. The bolt main body part 91*a* is shaped like a circular cylinder extending in the vertical direction Z. On an outer circumferential surface of the bolt main body part 91*a*, there is formed an external thread part which meshes with the internal thread part formed on the inner circumferential surface of the internal threaded hole 81*c*. The bolt main body part 91*a* is threaded from below through the through hole 61*j* to protrude above the first circuit board 61, and is tightened into the internal threaded hole 81*c*. Thus, the bolt main body part 91*a* is tightened into the metal member 80. In the present embodiment, an upper end portion of the bolt main body part 91*a* protrudes above the cylindrical part 81*b*.

The bolt head part 91*b* is disposed at one end, namely a lower end, of the bolt main body part 91*a*. The bolt head part 91*b* extends in a direction perpendicular to the vertical direction Z from a lower end of the bolt main body part 91*a*. An outer diameter of the bolt head part 91*b* is larger than an outer diameter of the bolt main body part 91*a*. The outer diameter of the bolt head part 91*b* is larger than the inner diameter of the through hole 61*j*. The bolt head part 91*b* has contact with the first ground pad part 61*g* of the first ground layer 61*b* from below. Thus, the bolt head part 91*b* has contact with the first ground layer 61*b* on a surface opposite to the surface opposed to the second circuit board 62, namely the lower surface, of the first circuit board 61.

By the bolt main body part 91*a* being tightened into the first coupling part 81 having contact with the first ground pad part 61*i* of the first ground layer 61*c*, and the bolt head part 91*b* having contact with the first ground pad part 61*g* of the first ground layer 61*b*, the pair of first ground layers 61*b*, 61*c* disposed as layers different from each other are electrically coupled to each other via the bolt 91 and the first coupling part 81.

The second coupling part 82 protrudes toward the other side in the second horizontal direction from the other end in the vertical direction Z of the main body part 83, namely an upper end of the main body part 83. In other words, the second coupling part 82 protrudes from the other end in the vertical direction Z of the main body part 83 in a direction different from a direction in which the first coupling part 81 protrudes. In the present embodiment, the direction in which the second coupling part 82 with respect to the main body part 83 is opposite to the direction in which the first coupling part 81 protrudes with respect to the main body part 83.

The second coupling part 82 is shaped like a substantially rectangular plate having a plate surface facing to the vertical direction Z. The second coupling part 82 has contact with the second ground pad part 62*i* of the second ground layer 62*c* from below. An upper surface of the second coupling part 82 is a second coupling surface 82*f* electrically coupled to the second ground layer 62*c*. The second coupling surface 82*f* has contact with the second ground pad part 62*i*. Thus, the metal member 80 has contact with the second ground layer 62*c* on a surface opposed to the first circuit board 61, namely the lower surface, of the second circuit board 62. The second coupling surface 82*f* extends along the second ground layer 62*c* in a direction perpendicular to the vertical direction Z.

The second coupling part 82 has a plate-like part 82*a* and a cylindrical part 82*b*. The plate-like part 82*a* is a part shaped like a substantially rectangular plate. An upper surface of the plate-like part 82*a* is the second coupling surface 82*f*. The cylindrical part 82*b* protrudes downward from the plate-like part 82*a*. The cylindrical part 82*b* is shaped like a circular cylinder opening downward.

The second coupling part 82 is provided with an internal threaded hole 82*c*. The internal threaded hole 82*c* penetrates the second coupling part 82 in the vertical direction Z. More particularly, the internal threaded hole 82*c* penetrates the plate-like part 82*a* and the cylindrical part 82*b* in the vertical direction Z. An inner circumferential surface of the cylindrical part 82*b* constitutes a part of an inner circumferential surface of the internal threaded hole 82*c*. The inner circumferential surface of the internal threaded hole 82*c* is provided with an internal thread part.

In the internal threaded hole 82*c*, there is tightened a bolt 92 made of metal for fixing the second coupling part 82 to the second circuit board 62. The bolt 92 is threaded from above through a through hole 62*j* provided to the second circuit board 62. The through hole 62*j* penetrates the second circuit board 62 in the vertical direction Z. An inner diameter of the through hole 62*j* is larger than an inner diameter of the internal threaded hole 82*c*.

The bolt 92 has a bolt main body part 92*a* and a bolt head part 92*b*. The bolt main body part 92*a* is shaped like a circular cylinder extending in the vertical direction Z. On an outer circumferential surface of the bolt main body part 92*a*, there is formed an external thread part which meshes with the internal thread part formed on the inner circumferential surface of the internal threaded hole 82*c*. The bolt main body part 92*a* is threaded from above through the through hole 62*j* to protrude below the second circuit board 62, and is tightened into the internal threaded hole 82*c*. Thus, the bolt main body part 92*a* is tightened into the metal member 80. In the present embodiment, a lower end portion of the bolt main body part 92*a* protrudes below the cylindrical part 82*b*.

The bolt head part 92*b* is disposed at one end, namely an upper end, of the bolt main body part 92*a*. The bolt head part 92*b* extends in a direction perpendicular to the vertical direction Z from an upper end of the bolt main body part 92*a*. An outer diameter of the bolt head part 92*b* is larger than an outer diameter of the bolt main body part 92*a*. The outer diameter of the bolt head part 92*b* is larger than the inner diameter of the through hole 62*j*. The bolt head part 92*b* has contact with the second ground pad part 62*g* of the second ground layer 62*b* from above. Thus, the bolt head part 92*b* has contact with the second ground layer 62*b* on a surface opposite to the surface opposed to the first circuit board 61, namely the upper surface, of the second circuit board 62.

By the bolt main body part 92*a* being tightened into the second coupling part 82 having contact with the second ground pad part 62*i* of the second ground layer 62*c*, and the bolt head part 92*b* having contact with the second ground pad part 62*g* of the second ground layer 62*b*, the pair of second ground layers 62*b*, 62*c* disposed as layers different from each other are electrically coupled to each other via the bolt 92 and the second coupling part 82.

As shown in FIG. 6, a first distance L1*a* between the metal member 80 and the connector unit 70 adjacent to each other is shorter than a second distance L2 between the first circuit board 61 and the second circuit board 62 opposed to each other. The first distance L1*a* is the shortest distance along the first horizontal direction X between the side surface 83*a* of the main body part 83 in the metal member 80 and the connector unit 70. The second distance L2 is the shortest distance along the vertical direction Z between the upper surface of the first circuit board 61 and the lower surface of the second circuit board 62. In the present embodiment, the first distance L1*a* is no larger than a half of the second distance L2. The first distance L1*a* is, for example, no smaller than about 0.5 mm and no larger than about 20 mm. It is preferable for the first distance L1*a* to be, for example, smaller than 10 mm. The second distance L2 is, for example, no smaller than about 10 mm and no larger than about 30 mm. The first distance L1*a* is smaller than a dimension in the second horizontal direction Y of the connector unit 70.

According to the present embodiment, the circuit board unit 60 is provided with the first circuit board 61 having the first ground layer 61*c*, the second circuit board 62 having the second ground layer 62*c* and arranged so as to be opposed to the first circuit board 61, the connector unit 70 having the first connector 71 attached to the first circuit board 61 and the second connector 72 attached to the second circuit board 62 and is coupled to the first connector 71, and the metal member 80 arranged between the first circuit board 61 and the second circuit board 62, and electrically coupling the first ground layer 61*c* and the second ground layer 62*c* to each other. The metal member 80 is arranged so as to be adjacent to the connector unit 70.

Therefore, due to the metal member 80, it is possible to dispose a return path through which a return current flows between the first circuit board 61 and the second circuit board 62. Since the metal member 80 is arranged so as to be adjacent to the connector unit 70, it is possible to arrange the metal member 80 close to the connector unit 70. Thus, it is possible to make the return current corresponding to a current flowing through the connector unit 70 easy to flow through the metal member 80. Therefore, it is possible to cancel out the electromagnetic field generated by the current flowing through the connector unit 70 with the electromagnetic field generated by the return current flowing through the metal member 80 in good condition. Therefore, it is possible to prevent an unwanted radiation noise caused by the current flowing through the connector unit 70 for coupling the first circuit board 61 and the second circuit board 62 to each other from occurring in good condition. In other words, since the energy of the current flowing through the connector unit 70 and the energy of the return current are balanced out to make the excess energy difficult to occur, it is possible to suppress the unwanted radiation noise caused by the excess energy in good condition. It should be noted that the current flowing through the connector unit 70 includes the currents flowing via the first couplers 75*a* and the second couplers 76*a*, and the currents flowing via the first couplers 75*b* and the second couplers 76*b*.

Further, since it is possible to electrically couple the first ground layer 61*c* of the first circuit board 61 and the second ground layer 62*c* of the second circuit board 62 to each other with the metal member 80, it is possible to stabilize the potentials of the respective ground layers in good condition. Thus, it is possible to prevent the unwanted radiation noise caused by the currents flowing through the signal lines 77, 78 along the ground layers in better condition.

Further, due to the metal member 80, it is possible to dispose the paths of the return current such as the first ground layers 61*b*, 61*c* and the second ground layers 62*b*, 62*c* with respect to the connector unit 70. Therefore, even when the couplers of the connector unit 70 are separated from the respective circuit boards, it is possible to provide the paths of the return current to the couplers separated from the respective circuit boards due to the metal member 80. Thus, it is possible to shorten the path of the return current in each of the wiring layers provided to the couplers and the circuit boards compared to when the metal member 80 is not disposed. Therefore, it is possible to make the design of the paths of the return current in the couplers easy, and it is possible to prevent the quality of the signal flowing through the couplers from becoming worse.

Further, the structure of disposing the metal member 80 becomes simpler than the structure in which the connector unit 70 having the first connector 71 and the second connector 72 is surrounded by a shield member from the outside. Therefore, it is possible to prevent the structure of the circuit board unit 60 from becoming complicated compared to such a configuration as surrounding the connector unit 70 with the shield member. Therefore, it is possible to prevent the manufacturing cost of the circuit board unit 60 from increasing.

Further, according to the present embodiment, the first distance L1*a* between the metal member 80 and the connector unit 70 adjacent to each other is shorter than the second distance L2 between the first circuit board 61 and the second circuit board 62 opposed to each other. Therefore, it is possible to make the metal member 80 come closer to the connector unit 70 in better condition. Thus, it is possible to make the return current corresponding to the current flowing through the connector unit 70 easy to flow through the metal member 80 in good condition. Therefore, it is possible to cancel out the electromagnetic field generated by the current flowing through the connector unit 70 with the electromagnetic field generated by the return current flowing through the metal member 80 in better condition. Therefore, it is possible to prevent an unwanted radiation noise caused by the current flowing through the connector unit 70 for coupling the first circuit board 61 and the second circuit board 62 to each other from occurring in better condition.

Further, according to the present embodiment, the connector unit 70 has a shape elongated in the first horizontal direction X when viewed in the coupling direction in which the first connector 71 and the second connector 72 are coupled to each other, namely the vertical direction Z. The metal member 80 is arranged so as to be adjacent in the first horizontal direction X to the connector unit 70. When the connector unit 70 has a shape elongated in one direction, in most cases, the couplers of the connector unit 70 are arranged side by side in the longitudinal direction of the connector unit 70 as in the present embodiment. In this case, the signal lines 77, 78 are apt to be arranged respectively at both sides in the short side direction of the connector unit 70, namely the second horizontal direction Y. Therefore, by arranging the metal member 80 at a position adjacent to the connector unit 70 in the longitudinal direction of the connector unit 70, namely the first horizontal direction X as the predetermined direction, it is possible to arrange the metal member 80 close to the connector unit 70 in good condition while preventing the metal member 80 from interfering with the signal lines 77, 78.

Further, according to the present embodiment, the first circuit board 61 is provided with the plurality of signal lines 77, 78 arranged in the first horizontal direction X and each electrically coupled to the first connector 71. The plurality of signal lines 77, 78 includes the first signal lines 77*a*, 78*a* and the second signal lines 77*b*, 78*b* through which the signals higher in frequency than the signals flowing through the first signal lines 77*a*, 78*a* flow. The second signal lines 77*b*, 78*b* are arranged at the positions closer to the metal member 80 than the first signal lines 77*a*, 78*a* in the first horizontal direction X. Here, the unwanted radiation noise caused by the current flowing through the connector unit 70 is apt to become higher as the frequency of the current flowing through the connector unit 70 becomes higher. Therefore, by arranging the second signal lines 77*b*, 78*b* through which the signal relatively high in frequency close to the metal member 80, it is possible to arrange the metal member 80 close to the couplers to which the second signal lines 77*b*, 78*b* are coupled out of the couplers of the connector unit 70 in good condition. Thus, it is possible to make the return current corresponding to the current relatively high in frequency out of the currents flowing through the respective couplers of the connector unit 70 easy to flow through the metal member 80 in good condition. Therefore, the unwanted radiation noise caused by the current flowing through the connector unit 70 can be prevented from occurring in better condition.

Further, according to the present embodiment, the metal member 80 has the first coupling surface 81*f* extending along the first ground layer 61*c* and electrically coupled to the first ground layer 61*c*, and the second coupling surface 82*f* extending along the second ground layer 62*c* and electrically coupled to the second ground layer 62*c*. Therefore, it is possible to increase the contact area between the metal member 80 and the first ground layer 61*c* and the contact area between the metal member 80 and the second ground layer 62*c* in good condition. Thus, it is easy to increase an amount of the return current flowing between the first ground layer 61*c* and the second ground layer 62*c* via the metal member 80 in better condition. Therefore, the unwanted radiation noise caused by the current flowing through the connector unit 70 can be prevented from occurring in better condition. Further, due to the metal member 80, it is possible to couple the first ground layer 61*c* and the second ground layer 62*c* to each other in better condition, and thus, it is possible to stabilize the potentials of the respective ground layers in better condition.

Further, according to the present embodiment, the metal member 80 has the main body part 83 extending in the coupling direction in which the first connector 71 and the second connector 72 are coupled to each other, namely the vertical direction Z, the first coupling part 81 having the first coupling surface 81*f*, and protruding from the one end in the coupling direction, namely the lower end, of the main body part 83, and the second coupling part 82 having the second coupling surface 82*f*, and protruding from the other end in the coupling direction, namely the upper end, of the main body part 83 in a direction different from the direction in which the first coupling part 81 protrudes. The main body part 83 is shaped like a plate, and has the side surface 83*a* arranged so as to be opposed to the connector unit 70. Therefore, it is possible to make the position of the first coupling surface 81*f* and the position of the second coupling surface 82*f* different from each other in a direction perpendicular to the vertical direction Z. Thus, it is possible to make the position where the first coupling surface 81*f* is coupled to the first circuit board 61 and the position where the second coupling surface 82*f* is coupled to the second circuit board 62 different from each other in the direction perpendicular to the vertical direction Z. Therefore, it is easy to adjust the position where each of the coupling surfaces is coupled in accordance with the arrangement or the like of the electronic components on the mounting surface of each of the circuit boards, and it is possible to increase the degree of freedom of the arrangement of the electronic components in each of the circuit boards. Further, by arranging the side surface 83*a* of the main body part 83 so as to be opposed to the connector unit 70, it is possible to make the return path with the metal member 80 in good condition. Further, the structure in which the position of the first coupling surface 81*f* described above and the position of the second coupling surface 82*f* are made different in a direction perpendicular to the vertical direction Z from each other can be adopted in good condition while using the sheet-metal member as the metal member 80 to thereby make it easy to form the metal member 80.

Further, according to the present embodiment, the first circuit board 61 has the pair of first ground layers 61*b*, 61*c* disposed as the layers different from each other. The pair of first ground layers 61*b*, 61*c* are electrically coupled to each other. Therefore, it is possible to stabilize the potentials of the pair of first ground layers 61*b*, 61*c*. Further, it is possible to make the return current easy to flow through the metal member 80 electrically coupled to the first ground layers 61*b*, 61*c* in better condition.

In the present embodiment, the second circuit board 62 is also provided with the pair of second ground layers 62*b*, 62*c*, and the pair of second ground layers 62*b*, 62*c* are electrically coupled to each other. Therefore, it is possible to stabilize the potentials of the pair of second ground layers 62*b*, 62*c*. Further, it is possible to make the return current easy to flow through the metal member 80 electrically connected to the second ground layers 62*b*, 62*c* in better condition.

Further, according to the present embodiment, the first circuit board 61 is provided with the through hole 61*j* penetrating the first circuit board 61. The bolt 91 made of metal is threaded through the through hole 61*j*. The bolt 91 has the bolt main body part 91*a* threaded through the through hole 61*j* and tightened into the metal member 80, and the bolt head part 91*b* disposed at one end of the bolt main body part 91*a*. The metal member 80 has contact with one of the pair of first ground layers 61*b*, 61*c* on the surface of the first circuit board 61, the surface being opposed to the second circuit board 62. The bolt head part 91*b* has contact with the other of the pair of first ground layers 61*b*, 61*c* on the surface of the first circuit board 61, the surface being opposite to the surface opposed to the second circuit board 62. Therefore, by fixing the metal member 80 to the first circuit board 61 with the bolt 91, it is possible to electrically couple the pair of first ground layers 61*b*, 61*c* to each other via the bolt 91 and the metal member 80 with ease and in good condition. Further, it is possible to stably fix the metal member 80 to the first circuit board 61 with the bolt 91.

In the present embodiment, the pair of second ground layers 62*b*, 62*c* are also electrically coupled to each other via the bolt 92. Therefore, it is possible to electrically couple the pair of second ground layers 62*b*, 62*c* to each other with ease and in good condition. Further, it is possible to stably fix the metal member 80 to the second circuit board 62 with the bolt 92.

Further, according to the present embodiment, the metal member 80 has the catching stop parts 81*d*, 81*e* respectively inserted into the catching hole parts 61*k*, 61*m* provided to the first circuit board 61. Therefore, when tightening the bolt 91 into the metal member 80, the catching stop parts 81*d*, 81*e* are respectively caught on the inner surfaces of the catching hole parts 61*k*, 61*m*, and thus, it is possible to prevent the metal member 80 from rotating with respect to the first circuit board 61. Thus, it is possible to make it easy to tighten the bolt 91 into the metal member 80, and thus, it is possible to make it easy to fix the metal member 80 to the first circuit board 61 with the bolt 91.

It should be noted that by fixing the metal member 80 to the second circuit board 62 with the bolt 92 after fixing the metal member 80 to the first circuit board 61 with the bolt 91, it is possible to prevent the metal member 80 from rotating with respect to the second circuit board 62 when fixing the metal member 80 to the second circuit board 62 with the bolt 92. Therefore, even when the second coupling part 82 is not provided with the catching stop part as in the present embodiment, it is possible to make it easy to fix the metal member 80 to the second circuit board 62 with the bolt 92.

Second Embodiment

Figure 7:
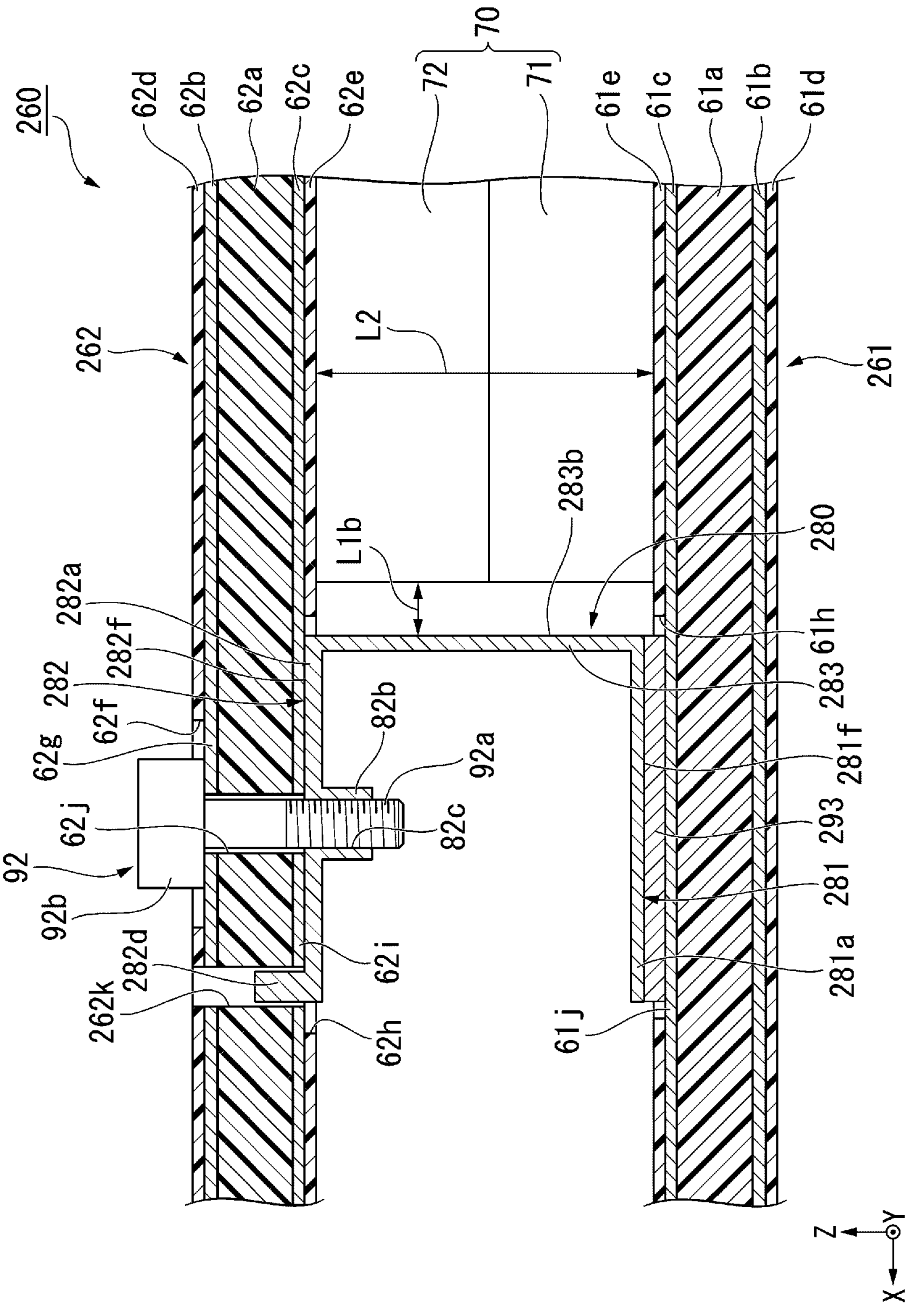
FIG. 7 is a cross-sectional view showing a part of a circuit board unit according to a second embodiment.
Figure 8:
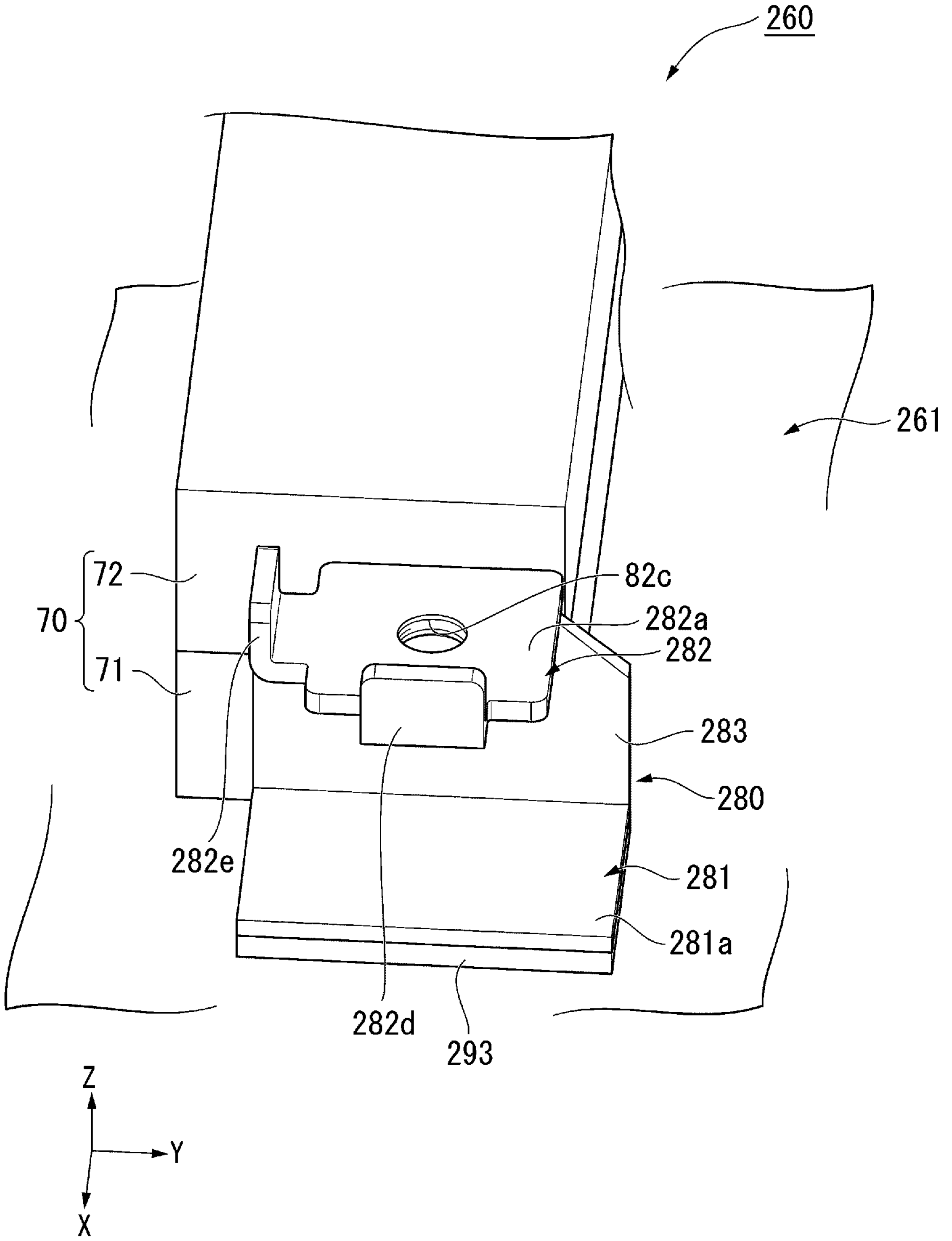
FIG. 8 is a perspective view showing a part of the circuit board unit according to the second embodiment.

The present embodiment is different in shape of a metal member 280 from the first embodiment. FIG. 7 is a cross-sectional view showing a part of a circuit board unit 260 according to the present embodiment. FIG. 8 is a perspective view showing a part of the circuit board unit 260 according to the present embodiment. It should be noted that in FIG. 7 and FIG. 8, the connector unit 70 is schematically shown. In the following description, constituents substantially the same as in the embodiment described above are arbitrarily denoted by the same reference symbols to thereby omit the description thereof in some cases.

As shown in FIG. 7, in the circuit board unit 260 in the present embodiment, a first circuit board 261 does not have the catching hole parts 61*k*, 61*m* and the through hole 61*j* unlike the first embodiment. A second circuit board 262 has a catching hole part 262*k* unlike the first embodiment. The catching hole part 262*k* penetrates the second circuit board 262 in the vertical direction Z.

As shown in FIG. 7 and FIG. 8, the metal member 280 in the present embodiment is a sheet-metal member, and is arranged so as to be adjacent to one side in the first horizontal direction of the connector unit 70. The metal member 280 has a main body part 283, a first coupling part 281, and a second coupling part 282. The main body part 283 extends in the coupling direction in which the first connector 71 and the second connector 72 are coupled to each other, namely the vertical direction Z. In the present embodiment, the main body part 283 is shaped like a substantially rectangular plate having a plate surface facing to the first horizontal direction X. A plate surface 283*b* at the other side in the first horizontal direction out of the plate surfaces of the main body part 283 is arranged so as to be opposed to the one side in the first horizontal direction of the connector unit 70. A distance in the first horizontal direction X between the plate surface 283*b* and the connector unit 70 is a first distance L1*b* between the metal member 280 and the connector unit 70 adjacent to each other, and is smaller than the second distance L2 between the first circuit board 261 and the second circuit board 262 adjacent to each other.

The first coupling part 281 protrudes toward the one side in the first horizontal direction from one end in the vertical direction Z of the main body part 283, namely a lower end of the main body part 283. In other words, the first coupling part 281 protrudes from the lower end of the main body part 283 toward a direction of getting away from the connector unit 70. The first coupling part 281 is shaped like a rectangular plate having a plate surface facing to the vertical direction Z. In the present embodiment, the first coupling part 281 is formed only of a plate-like part 281*a* shaped like a substantially rectangular plate.

As shown in FIG. 7, the first coupling part 281 has contact with the first ground pad part 61*i* of the first ground layer 61*c* via an electrically-conductive member 293. The electrically-conductive member 293 is a member which has an electrically-conductive property, and can elastically be deformed. The electrically-conductive member 293 is, for example, a gasket having an electrically-conductive property. A lower surface of the electrically-conductive member 293 has contact with the first ground pad part 61*i*. Thus, the electrically-conductive member 293 has contact with the first ground layer 61*c*. An upper surface of the electrically-conductive member 293 has contact with a lower surface of the first coupling part 281. Thus, the metal member 280 is electrically coupled to the first ground layer 61*c* via the electrically-conductive member 293. The lower surface of the first coupling part 281 is a first coupling surface 281*f* electrically coupled to the first ground layer 61*c* via the electrically-conductive member 293. The first coupling surface 281*f* extends along the first ground layer 61*c* in a direction perpendicular to the vertical direction Z. The electrically-conductive member 293 is in a state of being pressed from above by the metal member 280 to be provided with an elastic compressive deformation in the vertical direction Z.

The second coupling part 282 protrudes toward the one side in the first horizontal direction from the other end in the vertical direction Z of the main body part 283, namely an upper end of the main body part 283. In other words, the second coupling part 282 protrudes from the other end in the vertical direction Z of the main body part 283 in the same direction as the direction in which the first coupling part 281 protrudes. The second coupling part 282 is shaped like a substantially rectangular plate having a plate surface facing to the vertical direction Z. The second coupling part 282 is arranged above the first coupling part 281 so as to be opposed to the first coupling part 281 at a distance. The second coupling part 282 has contact with the second ground pad part 62*i* of the second ground layer 62*c*. An upper surface of the second coupling part 282 is a second coupling surface 282*f* electrically coupled to the second ground layer 62*c*. The second coupling surface 282*f* has contact with the second ground pad part 62*i*. Thus, the metal member 280 has contact with the second ground layer 62*c* on a surface opposed to the first circuit board 261, namely the lower surface, of the second circuit board 262. The second coupling surface 282*f* extends along the second ground layer 62*c* in a direction perpendicular to the vertical direction Z. Similarly to the first embodiment, the second coupling part 282 is fixed to the second circuit board 262 with the bolt 92.

The second coupling part 282 has a plate-like part 282*a*, a cylindrical part 82*b*, and catching stop parts 282*d*, 282*e*. The plate-like part 282*a* is a part shaped like a substantially rectangular plate. As shown in FIG. 8, a dimension in the second horizontal direction Y of the plate-like part 282*a* is smaller than a dimension in the second horizontal direction Y of the plate-like part 281*a* of the first coupling part 281. The catching stop part 282*d* protrudes upward from an edge portion at the one side in the first horizontal direction of the plate-like part 282*a*. The catching stop part 282*e* protrudes upward from an edge portion at the other side in the second horizontal direction of the plate-like part 282*a*. As shown in FIG. 7, the catching stop part 282*d* is inserted from below into the catching hole part 262*k* provided to the second circuit board 262. Although not shown in the drawings, the catching stop part 282*e* is inserted from below into another catching hole part provided to the second circuit board 262.

The rest of the configuration of the first circuit board 261 is substantially the same as the rest of the configuration of the first circuit board 61 in the first embodiment. The rest of the configuration of the second circuit board 262 is substantially the same as the rest of the configuration of the second circuit board 62 in the first embodiment. The rest of the configuration of the metal member 280 is substantially the same as the rest of the configuration of the metal member 80 in the first embodiment. The rest of the configuration of the circuit board unit 260 is substantially the same as the rest of the configuration of the circuit board unit 60 in the first embodiment.

According to the present embodiment, the metal member 280 has the main body part 283 extending in the coupling direction in which the first connector 71 and the second connector 72 are coupled to each other, namely the vertical direction Z, the first coupling part 281 having the first coupling surface 281*f*, and protruding from the one end in the coupling direction of the main body part 283 in the direction of getting away from the connector unit 70, and the second coupling part 282 having the second coupling surface 282*f*, and protruding from the other end in the coupling direction of the main body part 283 in the direction in which the first coupling part 281 protrudes. The main body part 283 is shaped like a plate, and has the plate surface 283*b* arranged so as to be opposed to the connector unit 70. Therefore, it is possible to arrange the whole of the main body part 283 close to the connector unit 70 in good condition. Thus, it is possible to make the return current corresponding to the current flowing through the connector unit 70 easy to flow through the metal member 280 in good condition. Therefore, it is possible to cancel out the electromagnetic field generated by the current flowing through the connector unit 70 with the electromagnetic field generated by the return current flowing through the metal member 280 in better condition. Therefore, it is possible to prevent an unwanted radiation noise caused by the current flowing through the connector unit 70 for coupling the first circuit board 261 and the second circuit board 262 to each other from occurring in good condition.

Further, according to the present embodiment, the circuit board unit 260 is provided with the electrically-conductive member 293 which can elastically be deformed. The electrically-conductive member 293 has contact with the first ground layer 61*c*. The metal member 280 is electrically coupled to the first ground layer 61*c* via the electrically-conductive member 293. Therefore, even when a variation occurs in the dimension in the vertical direction Z of the metal member 280, the variation in the dimension can be absorbed by the elastic deformation of the electrically-conductive member 293. Thus, it is possible to electrically couple the metal member 280 arranged between the first circuit board 261 and the second circuit board 262 to the first ground layer 61*c* of the first circuit board 261 and the second ground layer 62*c* of the second circuit board 262 in good condition irrespective of the variation in dimension in the vertical direction Z of the metal member 280. Further, by setting the electrically-conductive member 293 in the state of being provided with the elastic compression deformation, it is possible to press the metal member 280 against the second circuit board 262 due to the restorative force of the electrically-conductive member 293, and thus, it is possible to fixedly arrange the metal member 280 between the first circuit board 261 and the second circuit board 262 in good condition. Further, it is possible to easily fix the portion to be fixed to the first circuit board 261 out of the metal member 280, namely the first coupling part 281, to the first circuit board 261 compared to when fixing that portion to the first circuit board 261 with a bolt.

Third Embodiment

Figure 9:
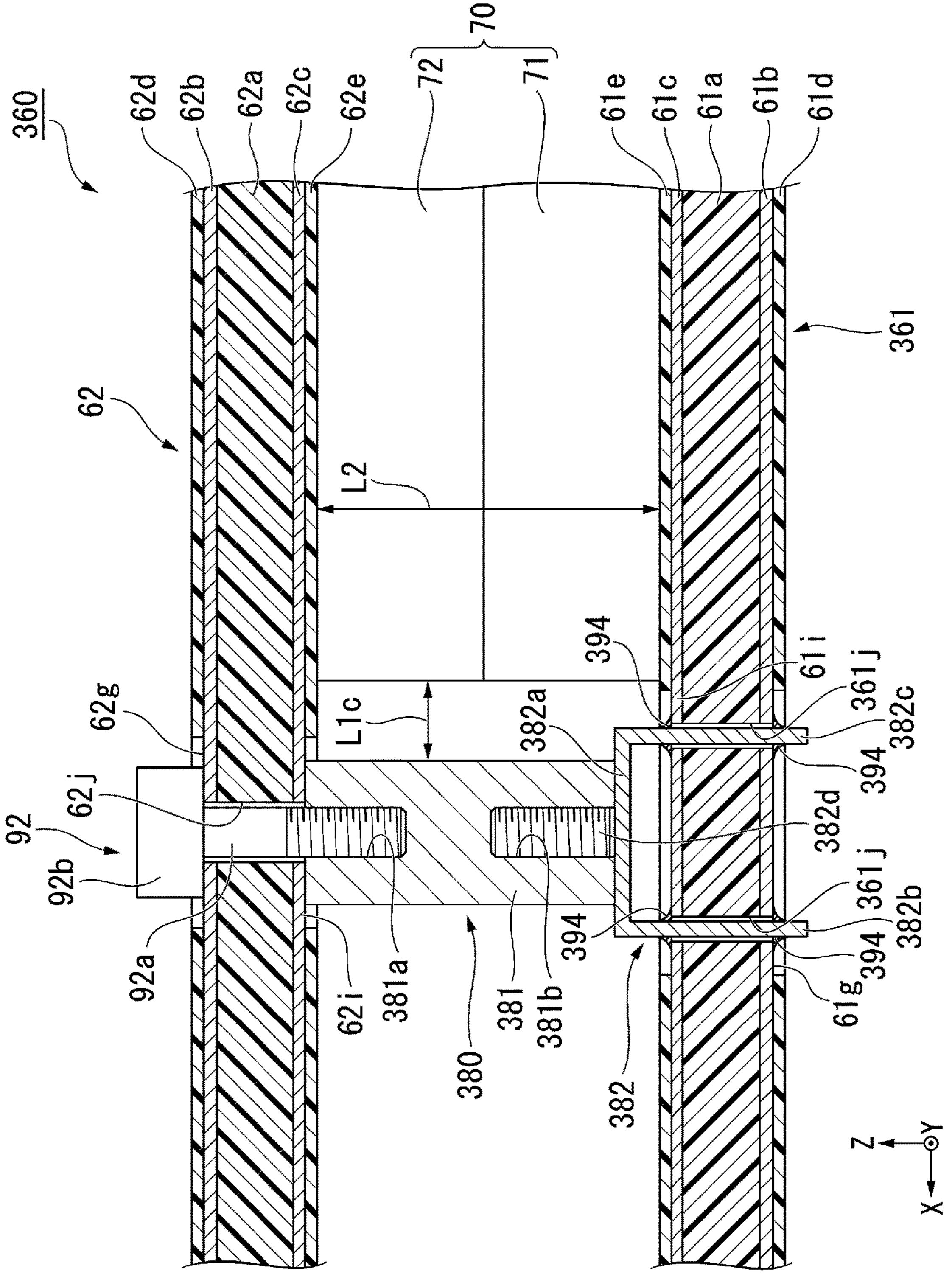
FIG. 9 is a cross-sectional view showing a part of a circuit board unit according to a third embodiment.
Figure 10:
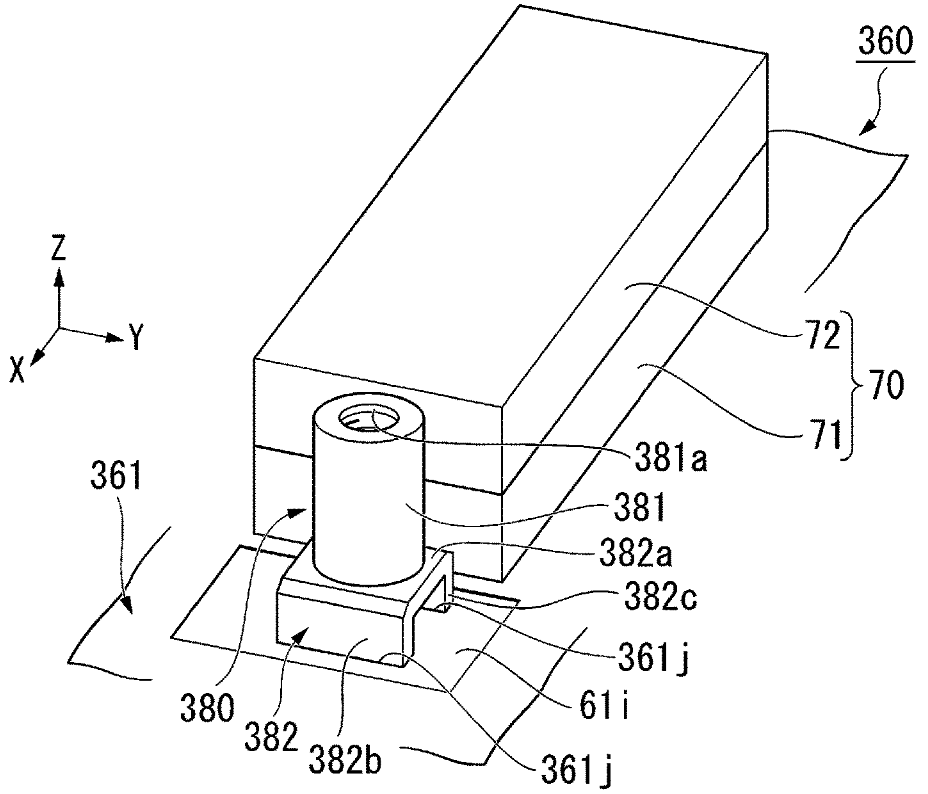
FIG. 10 is a perspective view showing a part of the circuit board unit according to the third embodiment.

The present embodiment is different in shape of a metal member 380 from the first embodiment. FIG. 9 is a cross-sectional view showing a part of a circuit board unit 360 according to the present embodiment. FIG. 10 is a perspective view showing a part of the circuit board unit 360 according to the present embodiment. It should be noted that in FIG. 9 and FIG. 10, the connector unit 70 is schematically shown. In the following description, constituents substantially the same as in the embodiments described above are arbitrarily denoted by the same reference symbols to thereby omit the description thereof in some cases.

As shown in FIG. 9, in the circuit board unit 360 in the present embodiment, a first circuit board 361 is provided with a pair of through holes 361*j*. The pair of through holes 361*j* penetrate the first circuit board 361 in the vertical direction Z. The pair of through holes 361*j* are arranged at a distance in the first horizontal direction X.

As shown in FIG. 9 and FIG. 10, the metal member 380 in the present embodiment is arranged so as to be adjacent to the one side in the first horizontal direction of the connector unit 70. In the present embodiment, the metal member 380 has a main body part 381 and a coupling part 382. The main body part 381 is shaped like a column extending in the coupling direction in which the first connector 71 and the second connector 72 are coupled to each other, namely the vertical direction Z. In the present embodiment, the main body part 381 is shaped like a circular cylinder extending in the vertical direction Z. The main body part 381 is arranged so as to be opposed in the first horizontal direction X to the connector unit 70. A distance in the first horizontal direction X between the main body part 381 and the connector unit 70 is a first distance L1*c* between the metal member 380 and the connector unit 70 adjacent to each other, and is smaller than the second distance L2 between the first circuit board 361 and the second circuit board 62 opposed to each other.

An upper surface of the main body part 381 is provided with an internal threaded hole 381*a* recessed downward. As shown in FIG. 9, a bolt main body part 92*a* of the bolt 92 is tightened into the internal threaded hole 381*a*. Thus, the main body part 381 is fixed to the second circuit board 62 with the bolt 92. The upper surface of the main body part 381 has contact with the second ground pad part 62*i* in the second ground layer 62*c* of the second circuit board 62. A lower surface of the main body part 381 is provided with an internal threaded hole 381*b* recessed upward. The lower surface of the main body part 381 is located at a distance above the upper surface of the first circuit board 361.

The coupling part 382 is connected at a lower side of the main body part 381. The coupling part 382 is an angulated U-shaped member opening downward when viewed in the second horizontal direction Y. The coupling part 382 has a base part 382*a*, a pair of leg parts 382*b*, 382*c*, and an external thread part 382*d*. The base part 382*a* is shaped like a rectangular plate having a plate surface facing to the vertical direction Z. An upper surface of the base part 382*a* has contact with the lower surface of the main body part 381. The base part 382*a* is arranged at a distance above the first circuit board 361. The external thread part 382*d* protrudes upward from the upper surface of the main body part 381. The external thread part 382*d* is tightened into the internal threaded hole 381*b* of the main body part 381 from below. Thus, the main body part 381 and the coupling part 382 are fixed to each other.

The pair of leg parts 382*b*, 382*c* respectively protrude downward from edge portion at both sides in the first horizontal direction X of the base part 382*a*. The pair of leg parts 382*b*, 382*c* are each shaped like a rectangular plate having a plate surface facing to the first horizontal direction X. The leg part 382*b* is inserted into one of the pair of through holes 361*j* from above to be threaded therethrough in the vertical direction Z. The leg part 382*c* is inserted into the other of the pair of through holes 361*j* from above to be threaded therethrough in the vertical direction Z. The pair of leg parts 382*b*, 382*c* protrude below the first circuit board 361 via the respective through holes 361*j*. The pair of leg parts 382*b*, 382*c* are each electrically coupled to a lower surface in the first ground pad part 61*g* of the first ground layer 61*b* and an upper surface in the first ground pad part 61*i* of the first ground layer 61*c* with solder 394. Thus, the first ground layer 61*b* and the first ground layer 61*c* are electrically coupled to each other via the pair of leg parts 382*b*, 382*c*.

The rest of the configuration of the first circuit board 361 is substantially the same as the rest of the configuration of the first circuit board 61 in the first embodiment. The rest of the configuration of the metal member 380 is substantially the same as the rest of the configuration of the metal member 80 in the first embodiment. The rest of the configuration of the circuit board unit 360 is substantially the same as the rest of the configuration of the circuit board unit 60 in the first embodiment.

According to the present embodiment, the metal member 380 has the main body part 381 shaped like a column extending in the coupling direction in which the first connector 71 and the second connector 72 are coupled to each other, namely the vertical direction Z. The main body part 381 is arranged so as to be opposed to the connector unit 70. By arranging the main body part 381 shaped like a column so as to be opposed to the connector unit 70, it is possible to increase the amount of the return current flowing through the main body part 381 in accordance with the current flowing through the connector unit 70 compared to when providing the main body part 381 with a plate-like shape. Thus, it is possible to cancel out the electromagnetic field generated by the current flowing through the connector unit 70 with the electromagnetic field generated by the return current flowing through the metal member 380 in better condition. Therefore, it is possible to prevent an unwanted radiation noise caused by the current flowing through the connector unit 70 for coupling the first circuit board 361 and the second circuit board 62 to each other from occurring in good condition.

Fourth Embodiment

Figure 11:
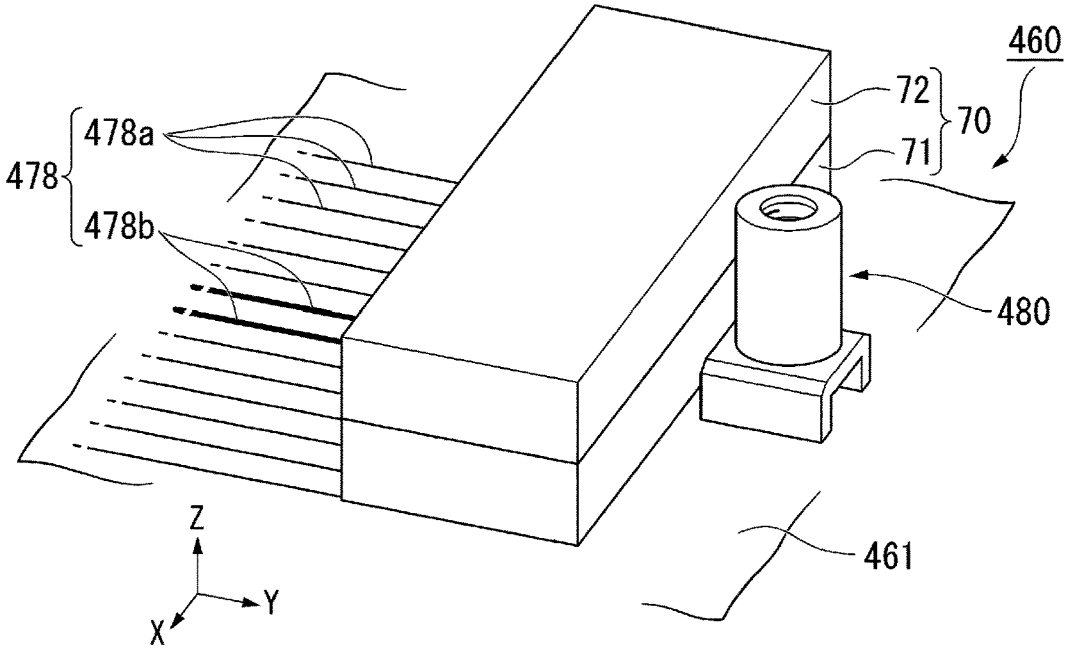
FIG. 11 is a perspective view showing a part of a circuit board unit according to a fourth embodiment.
Figure 12:
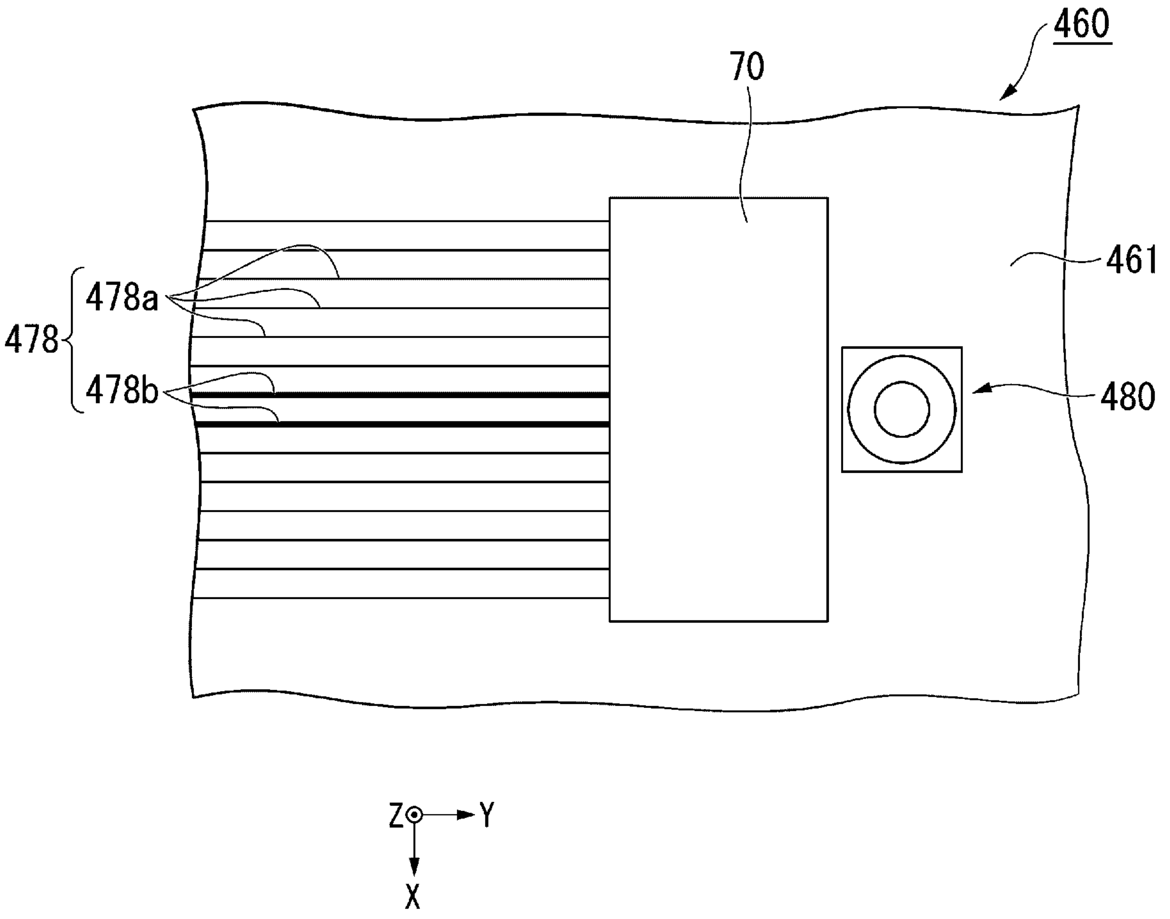
FIG. 12 is a plan view showing apart of the circuit board unit according to the fourth embodiment.

The present embodiment is different in arrangement of a metal member 480 with respect to the connector unit 70 from the third embodiment. FIG. 11 is a perspective view showing a part of a circuit board unit 460 according to the present embodiment. FIG. 12 is a plan view showing a part of the circuit board unit 460 according to the present embodiment. It should be noted that in FIG. 11 and FIG. 12, the connector unit 70 is schematically shown. In the following description, constituents substantially the same as in the embodiments described above are arbitrarily denoted by the same reference symbols to thereby omit the description thereof in some cases.

As shown in FIG. 11, in the circuit board unit 460 in the present embodiment, the signal lines 77 are not disposed in a portion located at the one side in the second horizontal direction of the connector unit 70 out of the first circuit board 461. A plurality of signal lines 478 disposed in a portion located at the other side in the second horizontal direction of the connector unit 70 out of the first circuit board 461 is arranged side by side in the first horizontal direction X. The plurality of signal lines 478 includes first signal lines 478*a* and second signal lines 478*b* through which the signals higher in frequency than the signals flowing through the first signal lines 478*a* flow similarly to the plurality of signal lines 78 in the first embodiment. There are disposed a plurality of the first signal lines 478*a* and a plurality of the second signal lines 478*b*. There are disposed two second signal lines 478*b*. The two second signal lines 478*b* are the signal lines 478 arranged in a central portion in the first horizontal direction X out of the plurality of signal lines 478.

In the present embodiment, the metal member 480 is arranged to be adjacent to the one side in the second horizontal direction of the connector unit 70. In other words, in the present embodiment, the metal member 480 is arranged so as to be adjacent in the second horizontal direction Y perpendicular to the first horizontal direction X to the connector unit 70. As shown in FIG. 12, the metal member 480 is arranged at an opposite side to the plurality of signal lines 478 across the connector unit 70 in the second horizontal direction Y when viewed from above. In other words, the plurality of signal lines 478 is arranged at a first side in the second horizontal direction Y, namely the −Y side, of the connector unit 70, and the metal member 480 is arranged at a second side in the second horizontal direction Y, namely the +Y side, of the connector unit 70.

A position in the first horizontal direction X of the metal member 480 is the same as a position in the first horizontal direction X in the central portion in the first horizontal direction X of the connector unit 70. The position in the first horizontal direction X of the metal member 480 includes a position in the first horizontal direction X of the second signal line 478*b*. In other words, when projecting a first portion located at an extreme first side and a second portion located at an extreme second side in the first horizontal direction X out of the metal member 480 at positions along the vertical direction Z of the second signal lines 478*b* when viewing the metal member 480 from the second horizontal direction Y, the positions of the second signal lines 478*b* are located between the first portion and the second portion in the first horizontal direction X. The metal member 480 is arranged at a position across the connector unit 70 in the second horizontal direction Y from the second signal lines 478*b* when viewed in the vertical direction Z. The metal member 480 is the same in shape as the metal member 380 in the third embodiment. It should be noted that in the present embodiment, the shape of the metal member can be the same as the shape of the metal member 80 in the first embodiment, or the shape of the metal member 280 in the second embodiment.

The rest of the configuration of the first circuit board 461 is substantially the same as the rest of the configuration of the first circuit board 361 in the third embodiment. The rest of the configuration of the metal member 480 is substantially the same as the rest of the configuration of the metal member 380 in the third embodiment. The rest of the configuration of the circuit board unit 460 is substantially the same as the rest of the configuration of the circuit board unit 360.

According to the present embodiment, the connector unit 70 has a shape elongated in the first horizontal direction X when viewed in the coupling direction in which the first connector 71 and the second connector 72 are coupled to each other, namely the vertical direction Z. The metal member 480 is arranged so as to be adjacent in the orthogonal direction perpendicular to the first horizontal direction X, namely the second horizontal direction Y, to the connector unit 70. Therefore, it is easy to increase the degree of freedom of the arrangement of the metal member 480 with respect to the connector unit 70 compared to when the metal member 480 is adjacent in the first horizontal direction X to the connector unit 70. Specifically, it is possible to adjust what position in the first horizontal direction X the metal member 480 is arranged at with respect to the connector unit 70, and thus, it is possible to set the arrangement of the metal member 480 in good condition in accordance with the current flowing through the connector unit 70. Therefore, it is possible to make the return current flow through the metal member 480 in good condition, and thus, the unwanted radiation noise caused by the current flowing through the connector unit 70 can be prevented from occurring in good condition.

Further, according to the present embodiment, the first circuit board 461 is provided with the plurality of signal lines 478 arranged in the first horizontal direction X and each electrically coupled to the first connector 71. The plurality of signal lines 478 includes the first signal lines 478*a* and the second signal lines 478*b* through which the signals higher in frequency than the signals flowing through the first signal lines 478*a* flow. The plurality of signal lines 478 is arranged in the second horizontal direction Y with respect to the connector unit 70. The metal member 480 is arranged at an opposite side to the plurality of signal lines 478 with respect to the connector unit 70. The position in the first horizontal direction X of the metal member 480 includes a position in the first horizontal direction X of the second signal line 478*b*. Therefore, it is possible to arrange the metal member 480 close to the couplers to which the second signal lines 478*b* are coupled out of the couplers of the connector unit 70 in good condition. Thus, it is possible to make the return current corresponding to the current relatively high in frequency out of the currents flowing through the respective couplers of the connector unit 70 easy to flow through the metal member 480 in good condition. Therefore, the unwanted radiation noise caused by the current flowing through the connector unit 70 can be prevented from occurring in better condition.

The embodiment of the present disclosure is not limited to the embodiments described above, and it is possible to adopt the following configurations and methods. The metal member can have any configurations providing the metal member is arranged between the first circuit board and the second circuit board, electrically couples the first ground layer and the second ground layer to each other, and is arranged so as to be adjacent to the connector unit. The metal member can be arranged so as to be adjacent in any directions to the connector unit. The metal member can have any shapes.

For example, in the third embodiment described above, the main body part 381 of the metal member 380 can be shaped like a column other than the circular cylinder such as a polygonal column. Further, in the third embodiment, the leg parts 382*b*, 382*c* of the metal member 380 are not required to penetrate the first circuit board 361, and can just be coupled to the first ground layer 61*c* on the upper surface of the first circuit board 361. Further, in the metal member 380 in the third embodiment, it is possible for the main body part 381 and the coupling part 382 to be fixed to each other with a bolt inserted from below into a hole penetrating the first circuit board 361. Further, in the third embodiment, it is possible to dispose a gasket having an electrically-conductive property between the base part 382*a* of the metal member 380 and the first circuit board 361.

The connector unit can have any configuration providing the connector unit has the first connector and the second connector coupled to each other. The first circuit board and the second circuit board can have any configurations providing the first circuit board and the second circuit board have the respective ground layers, and are arranged so as to be opposed to each other.

Further, although in the first embodiment described above, there is described the example when the present disclosure is applied to the transmissive projector, the present disclosure can also be applied to reflective projectors. Here, "transmissive" means that the liquid crystal light valve including the liquid crystal panel and so on is a type of transmitting light. Further, "reflective" means that the liquid crystal light valve is a type of reflecting the light. It should be noted that the light modulation device is not limited to the liquid crystal panel or the like, and can also be a light modulation device using, for example, micro-mirrors.

Further, although there is cited the example of the projector 1 using the three light modulation devices 4R, 4G, and 4B in the first embodiment described above, the present disclosure can also be applied to a projector using a single light modulation device alone or a projector using four or more light modulation devices.

Further, the electronic apparatus equipped with the circuit board and the electronic apparatus equipped with the circuit board unit are not limited to the projector, and can also be other electronic apparatuses.

Further, the configurations or the methods described in the present specification can arbitrarily be combined with each other within a range in which the configurations or the methods do not conflict with each other.

Conclusion of Present Disclosure

Hereinafter, the conclusion of the present disclosure will supplementarily be noted.

Supplementary Note 1

A circuit board unit including a first circuit board having a first ground layer, a second circuit board having a second ground layer and arranged so as to be opposed to the first circuit board, a connector unit having a first connector attached to the first circuit board, and a second connector attached to the second circuit board and coupled to the first connector, and a metal member arranged between the first circuit board and the second circuit board, and configured to electrically couple the first ground layer and the second ground layer to each other, wherein the metal member is arranged so as to be adjacent to the connector unit.

According to this configuration, due to the metal member, it is possible to dispose a return path through which a return current flows between the first circuit board and the second circuit board. Since the metal member is arranged so as to be adjacent to the connector unit, it is possible to arrange the metal member close to the connector unit. Thus, it is possible to make the return current corresponding to a current flowing through the connector unit easy to flow through the metal member. Therefore, it is possible to cancel out the electromagnetic field generated by the current flowing through the connector unit with the electromagnetic field generated by the return current flowing through the metal member in good condition. Therefore, it is possible to prevent an unwanted radiation noise caused by the current flowing through the connector unit for coupling the first circuit board and the second circuit board to each other from occurring in good condition.

Further, since it is possible to electrically couple the first ground layer of the first circuit board and the second ground layer of the second circuit board to each other with the metal member, it is possible to stabilize the potentials of the respective ground layers in good condition. Thus, it is possible to prevent the unwanted radiation noise caused by the currents flowing through the signal lines and so on along the ground layers in better condition.

Further, due to the metal member, it is possible to dispose the paths of the return current such as the first ground layers and the second ground layers with respect to the connector unit. Therefore, even when the couplers of the connector unit are separated from the respective circuit boards, it is possible to provide the paths of the return current to the couplers separated from the respective circuit boards due to the metal member. Thus, it is possible to shorten the path of the return current in each of the wiring layers provided to the couplers and the circuit boards compared to when the metal member is not disposed. Therefore, it is possible to make the design of the paths of the return current in the couplers easy, and it is possible to prevent the quality of the signal flowing through the couplers from becoming worse.

Further, the structure of disposing the metal member becomes simpler than the structure in which the connector unit having the first connector and the second connector is surrounded by a shield member from the outside. Therefore, it is possible to prevent the structure of the circuit board unit from becoming complicated compared to such a configuration as surrounding the connector unit with the shield member. Therefore, it is possible to prevent the manufacturing cost of the circuit board unit from increasing.

Supplementary Note 2

The circuit board unit described in Supplementary Note 1, wherein a first distance between the metal member and the connector unit adjacent to each other is shorter than a second distance between the first circuit board and the second circuit board opposed to each other.

According to this configuration, it is possible to make the metal member come closer to the connector unit in better condition. Thus, it is possible to make the return current corresponding to a current flowing through the connector unit easy to flow through the metal member in good condition. Therefore, it is possible to cancel out the electromagnetic field generated by the current flowing through the connector unit with the electromagnetic field generated by the return current flowing through the metal member in better condition. Therefore, it is possible to prevent an unwanted radiation noise caused by the current flowing through the connector unit for coupling the first circuit board and the second circuit board to each other from occurring in better condition.

Supplementary Note 3

The circuit board unit described in one of Supplementary Note 1 and Supplementary Note 2, wherein the connector unit has a shape elongated in a predetermined direction when viewed in a coupling direction in which the first connector and the second connector are coupled to each other, and the metal member is arranged so as to be adjacent in the predetermined direction to the connector unit.

According to this configuration, it is possible to arrange the metal member close to the connector unit in good condition while preventing the metal member from interfering with the signal lines provided to the circuit boards.

Supplementary Note 4

The circuit board unit described in Supplementary Note 3, wherein the first circuit board is provided with a plurality of signal lines arranged side by side in the predetermined direction, and each electrically coupled to the first connector, the plurality of signal lines includes a first signal line and a second signal line through which a signal higher in frequency than a signal flowing through the first signal line, and the second signal line is arranged at a position closer to the metal member than the first signal line in the predetermined direction.

According to this configuration, by arranging the second signal line through which the signal relatively high in frequency close to the metal member, it is possible to arrange the metal member close to the couplers to which the second signal line is coupled out of the couplers of the connector unit in good condition. Thus, it is possible to make the return current corresponding to the current relatively high in frequency out of the currents flowing through the respective couplers of the connector unit easy to flow through the metal member in good condition. Therefore, the unwanted radiation noise caused by the current flowing through the connector unit can be prevented from occurring in better condition.

Supplementary Note 5

The circuit board unit described in one of Supplementary Note 1 and Supplementary Note 2, wherein the connector unit has a shape elongated in a predetermined direction when viewed in a coupling direction in which the first connector and the second connector are coupled to each other, and the metal member is arranged so as to be adjacent in an orthogonal direction perpendicular to the predetermined direction to the connector unit.

According to this configuration, it is easy to increase the degree of freedom of the arrangement of the metal member with respect to the connector unit compared to when the metal member is adjacent in the predetermined direction to the connector unit. Specifically, it is possible to adjust what position in the predetermined direction the metal member is arranged at with respect to the connector unit, and thus, it is possible to set the arrangement of the metal member in good condition in accordance with the current flowing through the connector unit. Therefore, it is possible to make the return current flow through the metal member in good condition, and thus, the unwanted radiation noise caused by the current flowing through the connector unit can be prevented from occurring in good condition.

Supplementary Note 6

The circuit board unit described in Supplementary Note 5, wherein the first circuit board is provided with a plurality of signal lines arranged side by side in the predetermined direction, and each electrically coupled to the first connector, the plurality of signal lines includes a first signal line and a second signal line through which a signal higher in frequency than a signal flowing through the first signal line, the plurality of signal lines is arranged in the orthogonal direction with respect to the connector unit, the metal member is arranged at an opposite side to the plurality of signal lines with respect to the connector unit, and a position in the predetermined direction of the metal member includes a position in the predetermined direction of the second signal line.

According to this configuration, it is possible to arrange the metal member close to the coupler to which the second signal line is coupled out of the couplers of the connector unit in good condition. Thus, it is possible to make the return current corresponding to the current relatively high in frequency out of the currents flowing through the respective couplers of the connector unit easy to flow through the metal member in good condition. Therefore, the unwanted radiation noise caused by the current flowing through the connector unit can be prevented from occurring in better condition.

Supplementary Note 7

The circuit board unit described in any one of Supplementary Note 1 through Supplementary Note 6, wherein the metal member includes a first coupling surface extending along the first ground layer, and electrically coupled to the first ground layer, and a second coupling surface extending along the second ground layer, and electrically coupled to the second ground layer.

According to this configuration, it is possible to increase the contact area between the metal member and the first ground layer and the contact area between the metal member and the second ground layer in good condition. Thus, it is easy to increase an amount of the return current flowing between the first ground layer and the second ground layer via the metal member in better condition. Therefore, the unwanted radiation noise caused by the current flowing through the connector unit can be prevented from occurring in better condition. Further, due to the metal member, it is possible to couple the first ground layer and the second ground layer to each other in better condition, and thus, it is possible to stabilize the potentials of the respective ground layers in better condition.

Supplementary Note 8

The circuit board unit described in Supplementary Note 7, wherein the metal member includes a main body part extending in a coupling direction in which the first connector and the second connector are coupled to each other, a first coupling part having the first coupling surface, and protruding from one end in the coupling direction of the main body part, and a second coupling part having the second coupling surface, and protruding from another end in the coupling direction of the main body part in a direction different from a direction in which the first coupling part protrudes, and the main body part is shaped like a plate, and has a side surface arranged so as to be opposed to the connector unit.

According to this configuration, it is possible to make the position of the first coupling surface and the position of the second coupling surface different from each other in a direction perpendicular to the coupling direction. Thus, it is possible to make the position where the first coupling surface is coupled to the first circuit board and the position where the second coupling surface is coupled to the second circuit board different from each other in the direction perpendicular to the coupling direction. Therefore, it is easy to adjust the position where each of the coupling surfaces is coupled in accordance with the arrangement or the like of the electronic components on the mounting surface of each of the circuit boards, and it is possible to increase the degree of freedom of the arrangement of the electronic components in each of the circuit boards. Further, by arranging the side surface of the main body part so as to be opposed to the connector unit, it is possible to make the return path with the metal member in good condition. Further, the structure in which the position of the first coupling surface described above and the position of the second coupling surface are made different in a direction perpendicular to the coupling direction from each other can be adopted in good condition while using the sheet-metal member as the metal member to thereby make it easy to form the metal member.

Supplementary Note 9

The circuit board unit described in Supplementary Note 7, wherein the metal member includes a main body part extending in a coupling direction in which the first connector and the second connector are coupled to each other, a first coupling part having the first coupling surface, and protruding from one end in the coupling direction of the main body part in a direction of getting away from the connector unit, and a second coupling part having the second coupling surface, and protruding from another end in the coupling direction of the main body part in a same direction as a direction in which the first coupling part protrudes, and the main body part is shaped like a plate, and has a plate surface arranged so as to be opposed to the connector unit.

According to this configuration, it is possible to arrange the whole of the main body part close to the connector unit in good condition. Thus, it is possible to make the return current corresponding to a current flowing through the connector unit easy to flow through the metal member in good condition. Therefore, it is possible to cancel out the electromagnetic field generated by the current flowing through the connector unit with the electromagnetic field generated by the return current flowing through the metal member in better condition. Therefore, it is possible to prevent an unwanted radiation noise caused by the current flowing through the connector unit for coupling the first circuit board and the second circuit board to each other from occurring in good condition.

Supplementary Note 10

The circuit board unit described in any one of Supplementary Note 1 through Supplementary Note 9, wherein the metal member has a main body part shaped like a column extending in a coupling direction in which the first connector and the second connector are coupled to each other, and the main body part is arranged so as to be opposed to the connector unit.

According to this configuration, by arranging the main body part shaped like a column so as to be opposed to the connector unit, it is possible to increase the amount of the return current flowing through the main body part in accordance with the current flowing through the connector unit compared to when providing the main body part with a plate-like shape. Thus, it is possible to cancel out the electromagnetic field generated by the current flowing through the connector unit with the electromagnetic field generated by the return current flowing through the metal member in better condition. Therefore, it is possible to prevent an unwanted radiation noise caused by the current flowing through the connector unit for coupling the first circuit board and the second circuit board to each other from occurring in good condition.

Supplementary Note 11

The circuit board unit described in any one of Supplementary Note 1 through Supplementary Note 10, wherein the first circuit board has a pair of the first ground layers disposed as respective layers different from each other, and the pair of first ground layers are electrically coupled to each other.

According to this configuration, it is possible to stabilize the potentials of the pair of first ground layers. Further, it is possible to make the return current easy to flow through the metal member electrically connected to the first ground layers in better condition.

Supplementary Note 12

The circuit board unit described in Supplementary Note 11, wherein the first circuit board is provided with a through hole penetrating the first circuit board, a bolt made of metal is threaded through the through hole, the bolt includes a bolt main body part threaded through the through hole, and tightened into the metal member, and a bolt head part disposed at one end of the bolt main body part, the metal member has contact with one of the pair of first ground layers on a surface opposed to the second circuit board out of the first circuit board, and the bolt head part has contact with another of the pair of first ground layers on a surface opposite to the surface opposed to the second circuit board out of the first circuit board.

According to this configuration, by fixing the metal member to the first circuit board with the bolt, it is possible to electrically couple the pair of first ground layers to each other via the bolt and the metal member with ease and in good condition. Further, it is possible to stably fix the metal member to the first circuit board with the bolt.

Supplementary Note 13

The circuit board unit described in Supplementary Note 12, wherein the metal member has a catching stop part inserted into a catching hole part provided to the first circuit board.

According to this configuration, when tightening the bolt into the metal member, the catching stop part is caught on the inner surface of the catching hole part, and thus, it is possible to prevent the metal member from rotating with respect to the first circuit board. Thus, it is possible to make it easy to tighten the bolt into the metal member, and thus, it is possible to make it easy to fix the metal member to the first circuit board with the bolt.

Supplementary Note 14

The circuit board unit described in any one of Supplementary Note 1 through Supplementary Note 13, further including an electrically-conductive member which elastically deforms, wherein the electrically-conductive member has contact with the first ground layer, and the metal member is electrically coupled to the first ground layer via the electrically-conductive member.

According to this configuration, even when a variation occurs in the dimension of the metal member, the variation in the dimension can be absorbed by the elastic deformation of the electrically-conductive member. Thus, it is possible to electrically couple the metal member arranged between the first circuit board and the second circuit board to the first ground layer of the first circuit board and the second ground layer of the second circuit board in good condition irrespective of the variation in dimension of the metal member. Further, by setting the electrically-conductive member in the state of being provided with the elastic compression deformation, it is possible to press the metal member against the second circuit board due to the restorative force of the electrically-conductive member, and thus, it is possible to fixedly arrange the metal member between the first circuit board and the second circuit board in good condition. Further, it is possible to easily fix the portion to be fixed to the first circuit board out of the metal member to the first circuit board compared to when fixing that portion to the first circuit board with a bolt.

Supplementary Note 15

An electronic apparatus including the circuit board unit described in anyone of Supplementary Note 1 through Supplementary Note 14.

According to this configuration, the unwanted radiation noise caused by the current flowing through the connector unit can be prevented from occurring in the electronic apparatus in good condition.

What is claimed is:

1. A circuit board unit comprising:
a first circuit board having a first ground layer;
a second circuit board having a second ground layer and arranged so as to be opposed to the first circuit board;
a connector unit having a first connector attached to the first circuit board, and a second connector attached to the second circuit board and coupled to the first connector; and
a metal member arranged between the first circuit board and the second circuit board, and configured to electrically couple the first ground layer and the second ground layer to each other, wherein
the metal member is arranged so as to be adjacent to the connector unit,
the connector unit has a shape elongated in a predetermined direction when viewed in a coupling direction in which the first connector and the second connector are coupled to each other,
the metal member is arranged so as to be adjacent in the predetermined direction to the connector unit
the first circuit board is provided with a plurality of signal lines arranged side by side in the predetermined direction, the plurality of signal lines being each electrically coupled to the first connector,
the plurality of signal lines includes a first signal line and a second signal line through which a signal higher in frequency than a signal flowing through the first signal line, and
the second signal line is arranged at a position closer to the metal member than the first signal line in the predetermined direction.

2. The circuit board unit according to claim 1, wherein
a first distance between the metal member and the connector unit adjacent to each other is shorter than a second distance between the first circuit board and the second circuit board opposed to each other.

3. The circuit board unit according to claim 1, wherein
the metal member includes
a first coupling surface extending along the first ground layer, and electrically coupled to the first ground layer, and
a second coupling surface extending along the second ground layer, and electrically coupled to the second ground layer.

4. The circuit board unit according to claim 3, wherein
the metal member includes
a main body part extending in a coupling direction in which the first connector and the second connector are coupled to each other,
a first coupling part having the first coupling surface, and protruding from one end of the main body part in the coupling direction, and
a second coupling part having the second coupling surface, and protruding from another end of the main body part in the coupling direction along a direction different from a direction in which the first coupling part protrudes, and
the main body part is shaped like a plate, and has a side surface arranged so as to be opposed to the connector unit.

5. An electronic apparatus comprising:
the circuit board unit according to claim 1.

6. A circuit board unit comprising:
a first circuit board having a first ground layer;
a second circuit board having a second ground layer and arranged so as to be opposed to the first circuit board;
a connector unit having a first connector attached to the first circuit board, and a second connector attached to the second circuit board and coupled to the first connector; and
a metal member arranged between the first circuit board and the second circuit board, and configured to electrically couple the first ground layer and the second ground layer to each other, wherein
the metal member is arranged so as to be adjacent to the connector unit,
the first circuit board has a pair of the first ground layers disposed as respective layers different from each other, and
the pair of first ground layers are electrically coupled to each other.

7. The circuit board unit according to claim 6, wherein
the first circuit board is provided with a through hole penetrating the first circuit board,
a bolt made of metal is threaded through the through hole,
the bolt includes
a bolt main body part threaded through the through hole, and tightened into the metal member, and
a bolt head part disposed at one end of the bolt main body part,
the metal member has contact with one of the pair of first ground layers on a surface opposed to the second circuit board out of the first circuit board, and
the bolt head part has contact with another of the pair of first ground layers on a surface opposite to the surface opposed to the second circuit board out of the first circuit board.

8. A projector comprising:
a light source device that emits illumination light;
a color separation optical system that separates the illumination light into red light, green light, and blue light;
a first light modulation device that modulates the red light to form image light corresponding to the red light;
a second light modulation device that modulates the green light to form image light corresponding to the green light;
a third light modulation device that modulates the blue light to form image light corresponding to the blue light; and
a circuit board unit that controls the light source device, wherein
the circuit board unit comprises:
a first circuit board having a first ground layer;

a second circuit board having a second ground layer and arranged so as to be opposed to the first circuit board;

a connector unit having a first connector attached to the first circuit board, and a second connector attached to the second circuit board and coupled to the first connector; and a metal member arranged between the first circuit board and the second circuit board, and configured to electrically couple the first ground layer and the second ground layer to each other, the first circuit board has a pair of the first ground layers disposed as respective layers different from each other, and the pair of first ground layers are electrically coupled to each other.

9. The projector according to claim 8, wherein the first circuit board is provided with a through hole penetrating the first circuit board, a bolt made of metal is threaded through the through hole, the bolt includes a bolt main body part threaded through the through hole, and tightened into the metal member, and a bolt head part disposed at one end of the bolt main body part, the metal member has contact with one of the pair of first ground layers on a surface opposed to the second circuit board out of the first circuit board, and the bolt head part has contact with another of the pair of first ground layers on a surface opposite to the surface opposed to the second circuit board out of the first circuit board.

10. The projector according to claim 9, wherein the first light modulation device, the second light modulation device, and the third light modulation device are transmissive liquid crystal panels.

* * * * *